(12) United States Patent
Banba et al.

(10) Patent No.: US 7,368,205 B2
(45) Date of Patent: May 6, 2008

(54) POLYAMIDE RESIN, POSITIVE-WORKING PHOTOSENSITIVE RESIN COMPOSITION, METHOD FOR PRODUCING PATTERN-FORMED RESIN FILM, SEMICONDUCTOR DEVICE, DISPLAY DEVICE, AND METHOD FOR PRODUCING THE SEMICONDUCTOR DEVICE AND THE DISPLAY DEVICE

(75) Inventors: Toshio Banba, Tokyo (JP); Takashi Hirano, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 24 days.

(21) Appl. No.: 10/912,841

(22) Filed: Aug. 6, 2004

(65) Prior Publication Data
US 2005/0031994 A1    Feb. 10, 2005

(30) Foreign Application Priority Data
Aug. 6, 2003   (JP) ............................... 2003-288221

(51) Int. Cl.
G03F 7/023   (2006.01)
G03F 7/30    (2006.01)

(52) U.S. Cl. .................. 430/18; 430/165; 430/189; 430/191; 430/192; 430/193; 430/326; 430/330; 528/353

(58) Field of Classification Search ................ 430/189, 430/191, 192, 193, 165, 18, 326, 330; 528/353
See application file for complete search history.

(56) References Cited

U.S. PATENT DOCUMENTS

| | | | |
|---|---|---|---|
| 4,849,051 A | | 7/1989 | Ahne |
| 5,340,684 A | * | 8/1994 | Hayase et al. ............... 430/166 |
| 5,441,845 A | | 8/1995 | Okinoshima |
| 5,472,823 A | | 12/1995 | Higiwara |
| 5,518,864 A | * | 5/1996 | Oba et al. ................... 430/325 |
| 5,668,248 A | | 9/1997 | Hagiwara |
| 5,714,572 A | | 2/1998 | Kato |
| 6,127,086 A | * | 10/2000 | Waterson et al. ........... 430/190 |
| 6,143,467 A | * | 11/2000 | Hsu et al. ................. 430/270.1 |
| 6,177,225 B1 | * | 1/2001 | Weber et al. ............... 430/190 |
| 6,207,356 B1 | * | 3/2001 | Banba et al. ............... 430/326 |
| 6,376,151 B1 | * | 4/2002 | Takahashi et al. .......... 430/192 |
| 6,670,090 B1 | * | 12/2003 | Hsu et al. ................... 430/190 |

FOREIGN PATENT DOCUMENTS

| | | |
|---|---|---|
| DE | 4028515 A1 | 3/1992 |
| EP | 0373952 A | 6/1990 |
| EP | 0431971 A | 6/1991 |
| EP | 0554 040 A2 | 8/1993 |
| EP | 0554040 A | 8/1993 |
| EP | 0807852 A | 11/1997 |
| EP | 1331517 A | 7/2003 |
| JP | 1-46862 | 10/1989 |
| JP | 08254831 A | 10/1996 |

\* cited by examiner

Primary Examiner—John S. Chu
(74) Attorney, Agent, or Firm—Smith, Gambrell & Russell

(57) ABSTRACT

The invention provides a polyamide resin having a structure represented by the formula (1), wherein about 0.1 mol % to about 30 mol % of the total amount of Y in the formula (1) has a structure represented by the formula (2), further a positive-working photosensitive resin composition comprising a diazoquinone compound, a method for producing a pattern-formed resin film using the composition, a semiconductor device and a display device using the composition, and a method for producing the semiconductor device and the display device:

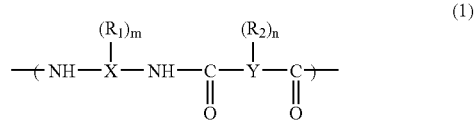

(1)

wherein, X is an organic group of 2 to 4 valences; Y is an organic group of 2 to 6 valences; $R_1$ is a hydroxyl group or $—O—R_3$ wherein m is an integer of 0 to 2; $R_2$ is a hydroxyl group, a carboxyl group, $—O—R_3$ or $—COO—R_3$ wherein n is an integer of 0 to 4; $R_3$ is an organic group having 1 to 15 carbon atoms;

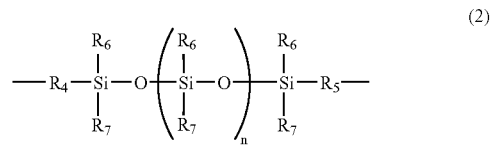

(2)

wherein, each of $R_4$ and $R_5$ is a divalent organic group; each of $R_6$ and $R_7$ is a monovalent organic group; n is an integer of 0 to 20.

25 Claims, 1 Drawing Sheet

POLYAMIDE RESIN, POSITIVE-WORKING PHOTOSENSITIVE RESIN COMPOSITION, METHOD FOR PRODUCING PATTERN-FORMED RESIN FILM, SEMICONDUCTOR DEVICE, DISPLAY DEVICE, AND METHOD FOR PRODUCING THE SEMICONDUCTOR DEVICE AND THE DISPLAY DEVICE

BACKGROUND OF THE INVENTION

1. Field of the Invention

The present invention relates to a polyamide resin, a positive-working photosensitive resin composition, a method for producing a pattern-formed resin film using the composition, a semiconductor device and a display device using the composition, and a method for producing the semiconductor device and the display device.

2. Description of the Related Art

A polybenzoxazole resin and a polyimide resin having high heat resistance, excellent electrical and mechanical properties or the like was conventionally used for a surface protective film or an interlayer insulation film of a semiconductor element. On the other hand, in order to simplify processes, a positive-working photosensitive resin composition comprising a combination of the polybenzoxazole resin or the polyimide resin and a photosensitive diazoquinone compound was used (for instance, Examined Japanese Patent Publication (JP-B) No. 1(1989)-46862).

In recent years, various liquid chemicals became to be used for treatment in wafer process because of shift to multi-layer wiring, chip size package (CSP), wafer level package (WLP) or the like due to down-sizing and higher integration of a semiconductor element. Particularly, Ti is used for barrier metal or the like in the WLP. Upon using Ti, hydrofluoric acid is often used for an etchant of Ti, and there is a problem that the positive-working photosensitive resins often peel off from a substrate during etching.

SUMMARY OF THE INVENTION

Adding a silane coupling agent or an adhesive auxiliary agent is explored as a way to solve the peeling problem, however, the effect thereof is weak. Thus, further positive-working photosensitive resin having resistance to hydrofluoric acid is desired.

In order to solve the above mentioned problem, the object of the present invention is to provide a polyamide resin which aims to provide a polybenzoxazole resin, a polyimide resin or a copolymer resin thereof excellent in resistance to hydrofluoric acid, a positive-working photosensitive resin composition excellent in resistance to hydrofluoric acid and development property using the polyamide resin, a method for producing pattern-formed resin film using the composition, a semiconductor device and a display device using the polyamide resin or the composition, and a method for producing the semiconductor device and the display device.

The present invention provides a polyamide resin having a structure represented by the formula (1), wherein about 0.1 mol % to about 30 mol % of the total amount of Y in the formula (1) has a structure represented by the formula (2):

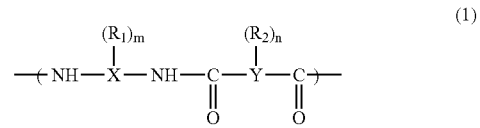

wherein, X is an organic group of 2 to 4 valences; Y is an organic group of 2 to 6 valences; $R_1$ is a hydroxyl group or $-O-R_3$ each of which may be the same or different from each other wherein m is an integer of 0 to 2; $R_2$ is a hydroxyl group, a carboxyl group, $-O-R_3$ or $-COO-R_3$ each of which may be the same or different from each other wherein n is an integer of 0 to 4; $R_3$ is an organic group having 1 to 15 carbon atoms (If $R_1$ is not a hydroxyl group, at least one of $R_2$ is a carboxyl group. If $R_2$ is not a carboxyl group, at least one of $R_1$ is a hydroxyl group);

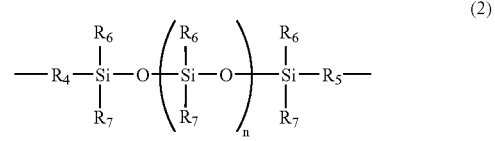

wherein, each of $R_4$ and $R_5$ is a divalent organic group, and may be the same or different from each other; each of $R_6$ and $R_7$ is a monovalent organic group, and may be the same or different from each other; n is an integer of 0 to 20.

The present invention provides a positive-working photosensitive resin composition comprising the polyamide resin (A) of the present invention, and a photosensitive diazoquinone compound (B).

The present invention provides a method for producing a pattern-formed resin film, comprising steps of: forming a composition layer by coating the positive-working photosensitive resin composition of the present invention on a substrate; forming a pattern by allowing the composition layer to be irradiated with an active energy ray and be in contact with a developing solution; and heating the composition.

The present invention provides a semiconductor device and a display device produced by using the polyamide resin or the positive-working photosensitive resin composition of the present invention.

The present invention provides a method for producing a semiconductor device and a display device wherein the semiconductor device and the display device are obtained by applying the positive-working photosensitive resin composition of the present invention on a semiconductor element or a substrate for display device so that a film thickness of the positive-working photosensitive resin composition becomes about 0.1 μm to about 50 μm after heating followed by prebaking, exposing, developing and heating.

Figure 1:
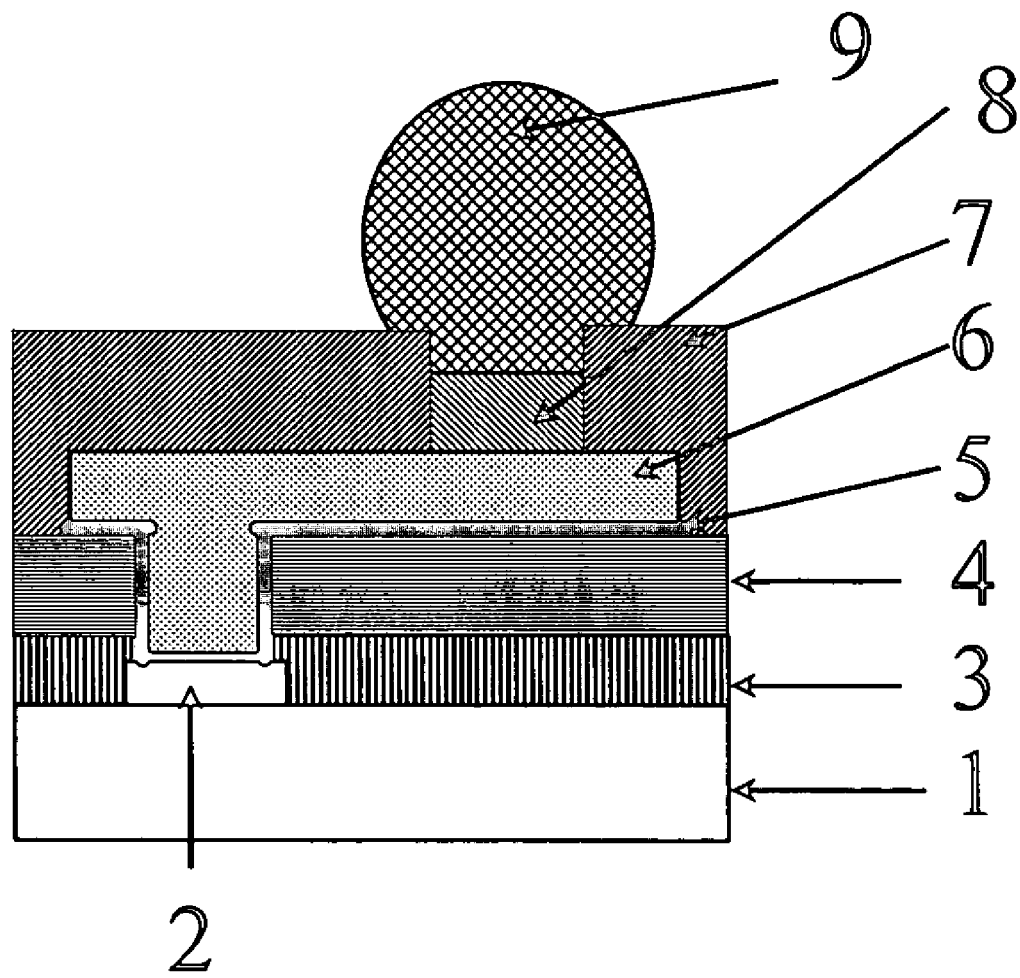
FIG. 1 is an enlarged cross-sectional view showing a pad portion of a semiconductor device having a bump of the present invention.

The sign in each figure refers to the following: a silicon wafer (1), an Al pad (2), a passivation film (3), a buffer coating film (4), a metal (Cr, Ti or the like) film (5), a wiring (Al, Cu or the like) (6), an insulation film (7), a barrier metal (8), and a solder bump (9).

DETAILED DESCRIPTION OF THE INVENTION

A polyamide resin of the present invention is a polyamide resin having a structure represented by the formula (1), wherein X represents an organic group of 2 to 4 valences, $R_1$ is a hydroxyl group or —O—$R_3$, and m is an integer of 0 to 2. Each of $R_1$ may be the same or different from each other. Y in the formula (1) represents an organic group of 2 to 6 valences, $R_2$ is a hydroxyl group, a carboxyl group, —O—$R_3$ or —COO—$R_3$, and n is an integer of 0 to 4. Each of $R_2$ may be the same or different from each other. Herein, $R_3$ is an organic group having 1 to 15 carbon atoms. If $R_1$ is not a hydroxyl group, at least one of $R_2$ is a carboxyl group. If $R_2$ is not a carboxyl group, at least one of $R_1$ is a hydroxyl group.

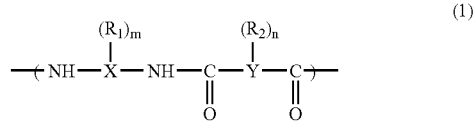

(1)

About 0.1 mol % to about 30 mol % of the total amount of Y in the formula (1) of the polyamide resin of the present invention has a structure represented by the formula (2):

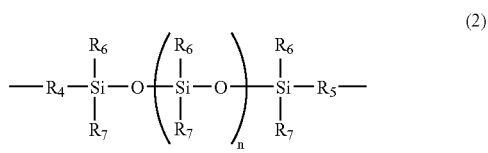

(2)

wherein, each of $R_4$ and $R_5$ is a divalent organic group, and may be the same or different from each other; each of $R_6$ and $R_7$ is a monovalent organic group, and may be the same or different from each other; n is an integer of 0 to 20.

If the amount of the structure represented by the formula (2) is less than about 0.1 mol % of the total amount of Y in the formula (1), effect of resistance to hydrofluoric acid, which is a feature of the present invention, cannot be observed. If the amount of the structure represented by the formula (2) is more than about 30 mol % of the total amount of Y in the formula (1), machine property of a cured film may decrease, hence it is not preferable. It is preferable that 1 mol % or more and 20 mol % or less of the total amount of Y in the formula (1) has the structure represented by the formula (2). The structure represented by the formula (2) may be a combination of two or more kinds.

In the formula (2), each of $R_4$ and $R_5$, which is a divalent organic group, is comprised of a straight-chain hydrocarbon chain, a branched-chain hydrocarbon chain or a cyclic hydrocarbon chain, or a combination thereof, wherein a heteroatom such as O, N or the like may be included, a hydrogen atom may be substituted by a halogen atom such as a fluorine atom or the like, and the ring may have a substituent in the hydrocarbon chain. The hydrocarbon includes a saturated hydrocarbon and an unsaturated hydrocarbon. The cyclic hydrocarbon chain may be comprised of an aromatic hydrocarbon or a cycloaliphatic hydrocarbon. The substituent wherein the ring may have is not particularly limited, but a straight-chain or branched-chain alkyl group is desirable. As for the substituent, a heteroatom may be included, one methylene group or two or more not adjacent methylene groups in the alkyl group may be substituted by —O—, —S—, —CO—, —CO—O— or —O—CO—, and a hydrogen atom in the alkyl group may be substituted by a halogen atom.

Among them, in view of resistance to hydrofluoric acid, each of $R_4$ and $R_5$ is preferably a divalent organic group comprising a aliphatic and/or aromatic hydrocarbon. Each of $R_4$ and $R_5$ is more preferably an alkylene, an arylene which may have an alkyl group, or a combination of an alkylene and an arylene which may have an alkyl group. Each of $R_4$ and $R_5$ preferably has 1 to 12 carbons, more preferably 1 to 6 carbons.

Each of $R_6$ and $R_7$ is a monovalent organic group, for instance, a hydrocarbon group which may contain a substituent, an alkoxy group, alkylamino group or the like, and further includes a non-hydrocarbon organic group such as an amino group, a halogen group or the like. The above mentioned hydrocarbon group includes a straight-chain hydrocarbon, a branched-chain hydrocarbon and a cyclic hydrocarbon, further includes a saturated hydrocarbon and an unsaturated hydrocarbon. The cyclic hydrocarbon includes an aromatic hydrocarbon and a cycloaliphatic hydrocarbon. As the hydrocarbon group which may contain a substituent, there may be an alkyl group which may contain a substituent and an aryl group which may contain a substituent. The substituent wherein the alkyl group may contain is not particularly limited and may contain a heteroatom. There may be, for example, an amino group, a mercapto group or the like, though an aryl group is preferable. The alkyl group may contain a heteroatom, one methylene group or two or more not adjacent methylene groups in the alkyl group may be substituted by —O—, —S—, —CO—, —CO—O— or —O—CO—. A hydrogen atom in the alkyl group may be substituted by a halogen atom. There may be, for example, (meth)acryloxyalkyl group or the like. Further, the substituent which may contain an aryl group is not particularly limited, though a straight-chain or branched-chain alkyl group is desirable. As for the substituent, a heteroatom may be included, one methylene group or two or more not adjacent methylene groups in the alkyl group may be substituted by —O—, —S—, —CO—, —CO—O— or —O—CO—, and a hydrogen atom in the alkyl group may be substituted by a halogen atom.

Among them, in view of resistance to hydrofluoric acid, each of $R_6$ and $R_7$ is preferably a monovalent organic group comprising an aliphatic and/or aromatic hydrocarbon, particularly, an alkyl group such as a methyl group, an isopropyl group or the like, an aryl group such as a phenyl group, a tolyl group or the like, or an aralkyl group such as a benzyl group, a phenethyl group or the like is more preferable. Each of $R_6$ and $R_7$ preferably has 1 to 12 carbons, more preferably 1 to 6 carbons, even more preferably 1 to 3 carbons.

"n" is preferably a small number, more preferably 1 to 3, even more preferably zero.

As the structure represented by the formula (2) which can be used in the present invention, there may be the following structures, for instance, but may not be limited:

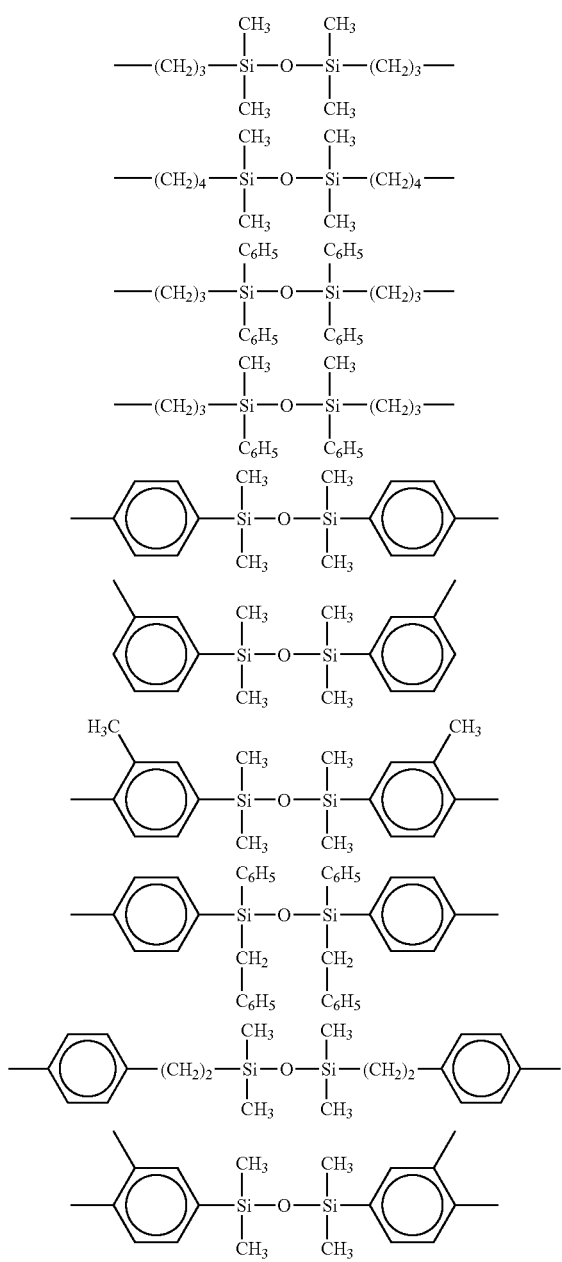

Among them, a structure represented below is preferable:

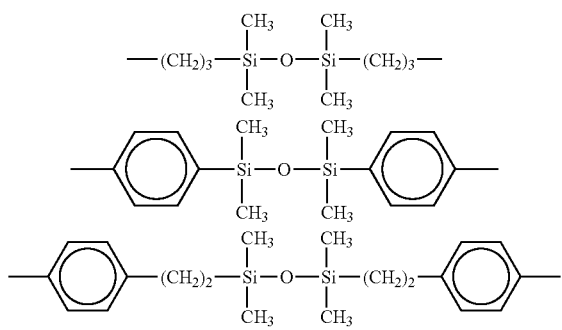

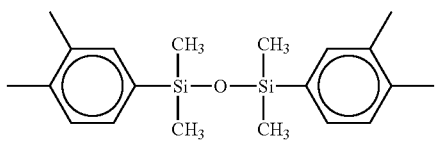

The polyamide resin containing the structure represented by the formula (1) is obtained by reacting a compound selected from a diamine, a bis (aminophenol), 2,4-diaminophenol or the like having the structure of X, and a compound selected from the formula (2), a tetracarboxylic anhydride, a trimellitic anhydride, a dicarboxylic acid, a dicarboxylic dichloride, a dicarboxylic acid derivative, a hydroxydicarboxylic acid, a hydroxydicarboxylic acid derivative or the like having the structure of Y. Incidentally, in the case of a dicarboxylic acid, an activated ester-type derivative of dicarboxylic acid reacted in advance with 1-hydroxy-1,2,3-benzotriazole or the like may be used so as to enhance a reaction yield or the like.

In the polyamide resin containing the structure represented by the formula (1), each of —O—$R_3$ as a substituent of X, and —O—$R_3$ and —COO—$R_3$ as a substituent of Y is the group derived from a hydroxyl group or a carboxyl group protected by an organic group $R_3$ having 1 to 15 carbon atoms if required for the purpose of adjusting solubility of the hydroxyl group or the carboxyl group to an alkaline aqueous solution. Examples of $R_3$ include a formyl group, a methyl group, an ethyl group, a propyl group, an isopropyl group, a tert-butyl group, a tert-butoxycarbonyl group, a phenyl group, a benzyl group, a tetrahydrofuranyl group, a tetrahydropyranyl group or the like.

The polyamide resin is dehydrated and cyclized by heating at about 250 to 400° C. to obtain a heat-resistant resin in a form of a polyimide resin, a polybenzoxazole resin or a copolymer of both polymers.

As X of the formula (1), there may be examples as follows, but may not be limited:

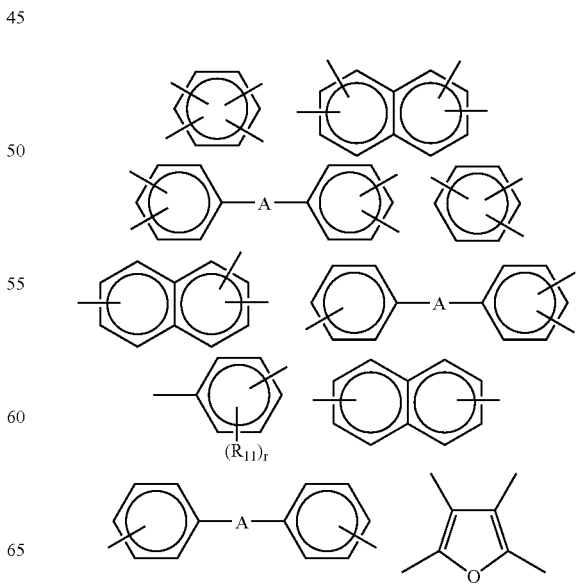

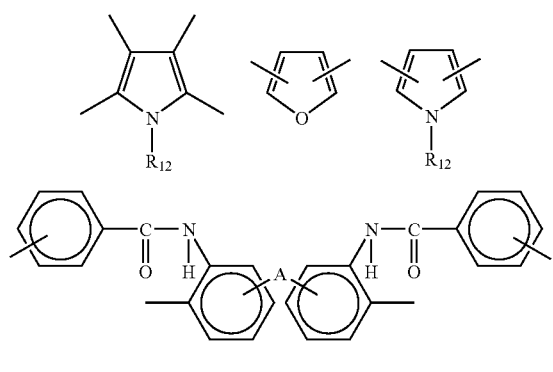

wherein, A is —CH$_2$—, —C(CH$_3$)$_2$—, —O—, —S—, —SO$_2$—, —CO—, —NHCO—, —C(CF$_3$)$_2$— or a single bond; R$_{11}$ is one group selected from an alkyl group, an alkyl ester group and a halogen atom, each of which may be the same or different from each other; r is an integer of 0 to 2; R$_{12}$ is one group selected from a hydrogen atom, an alkyl group, an alkyl ester group and a halogen atom.

Particularly preferable X among these is selected from the following and two or more kinds of these may be used:

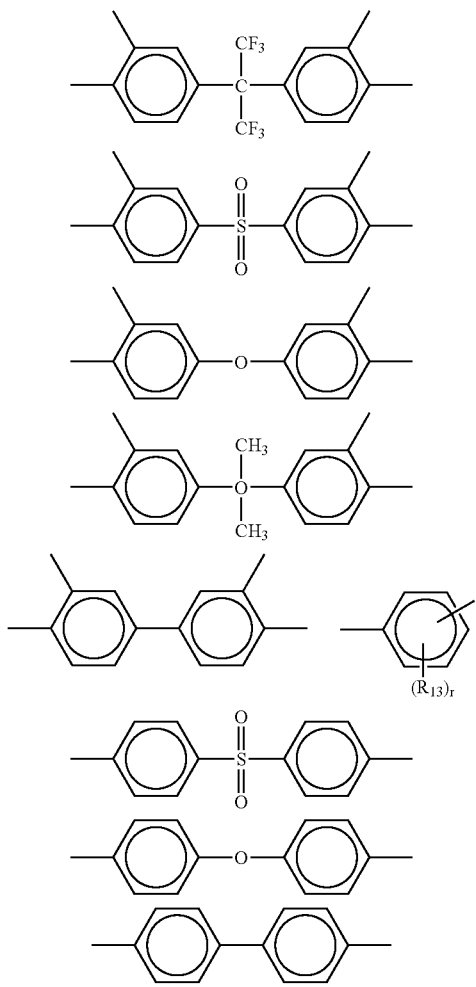

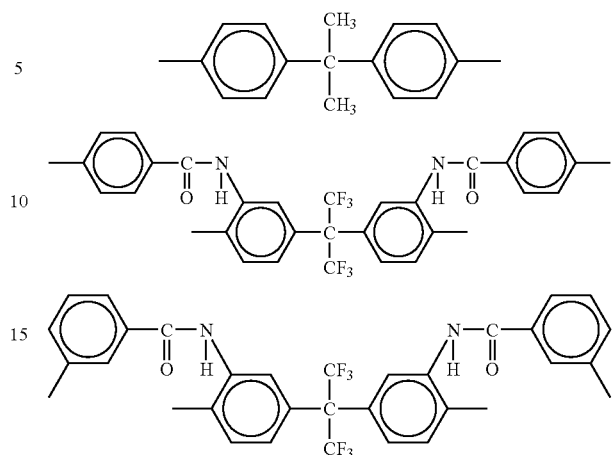

wherein, R$_{13}$ is one group selected from an alkyl group, an alkyl ester group and a halogen atom each of which may be the same or different from each other; r is an integer of 0 to 2.

As Y which can be used besides the group represented by the formula (2) in the polyamide resin having the structure represented by the formula (1), there may be examples as follows, but may not be limited:

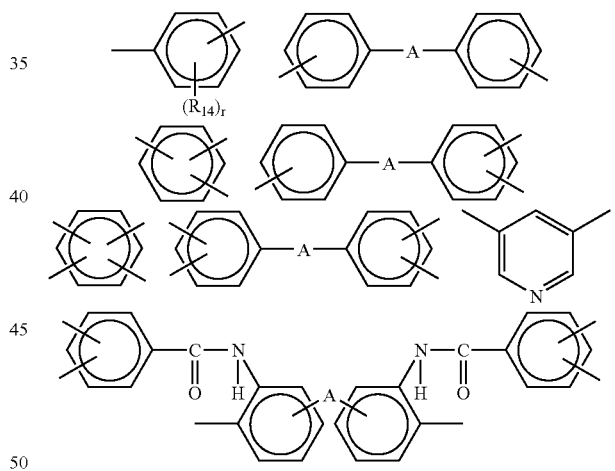

wherein, A is —CH$_2$—, —C(CH$_3$)$_2$—, —O—, —S—, —SO$_2$—, —CO—, —NHCO—, —C(CF$_3$)$_2$— or a single bond; R$_{14}$ is one group selected from an alkyl group and a halogen atom each of which may be the same or different from each other; r is an integer of 0 to 2.

Particularly preferable Y among these is selected from the followings and two or more kinds of these may be used:

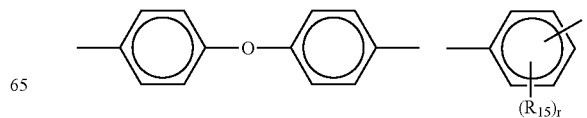

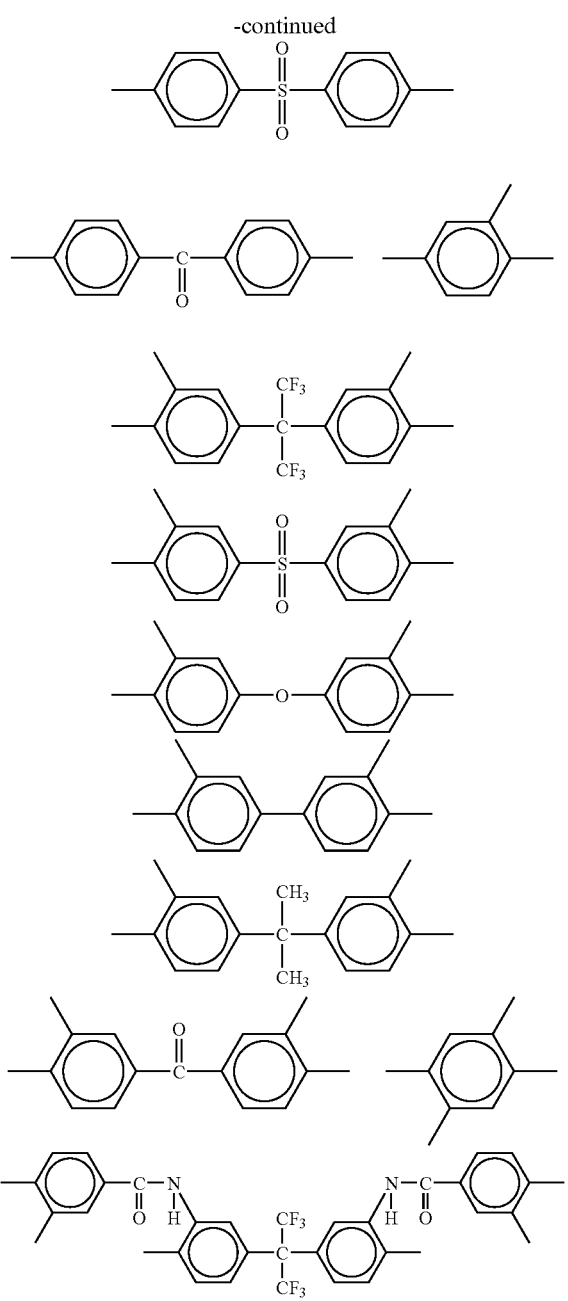

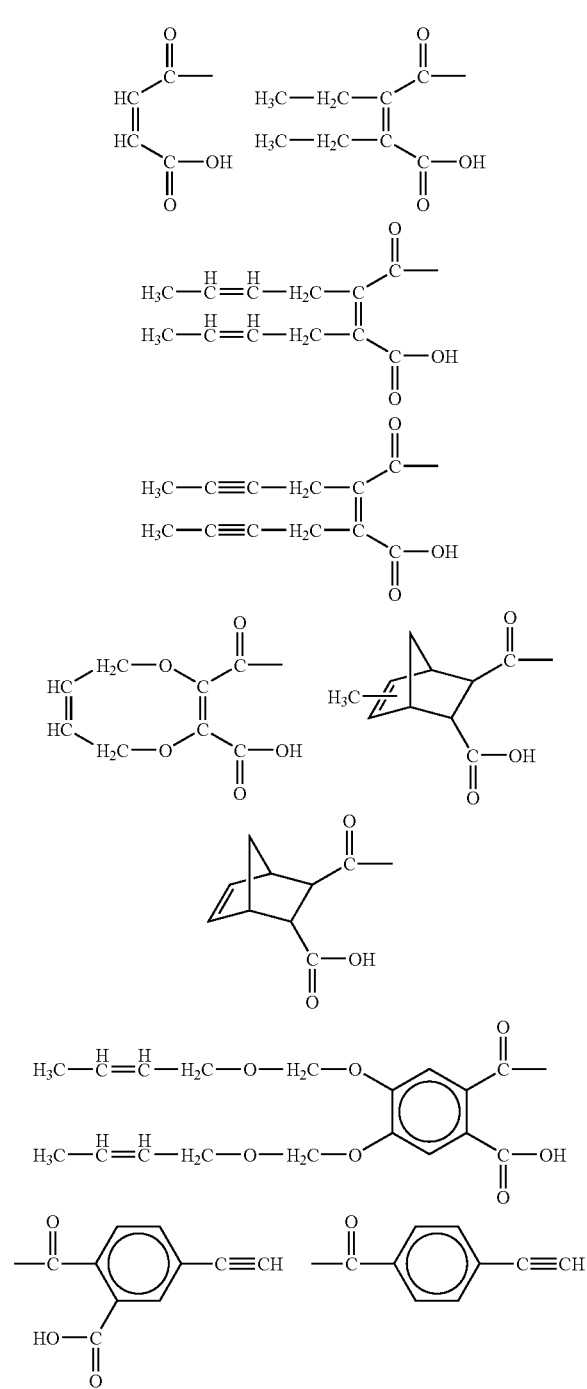

derivative, a hydroxydicarbonic acid, a hydroxydicarbonic acid derivative or the like having the structure of Y, an amino group located at a terminal of the polyamide resin is preferably capped with an acid anhydride or an acid derivative containing an aliphatic group or a cyclic compound group having at least one of an alkenyl group or an alkynyl group so that an amide is obtained. Examples of a group which originates in an acid anhydride or an acid derivative containing an aliphatic group or a cyclic compound group having at least one of an alkenyl group or an alkynyl group after reaction with an amino group include the followings but may not be limited:

wherein, $R_{15}$ is one group selected from an alkyl group and a halogen atom each of which may be the same or different from each other; r is an integer of 0 to 2.

In the present invention, from the viewpoint of storage stability, it is desirable to cap a terminal. A terminal of the polyamide represented by the formula (1) may be capped by introducing a derivative containing an aliphatic group or a cyclic compound group having at least one of an alkenyl group or an alkynyl group as an acid derivative or an amine derivative. Specifically, for instance, after the polyamide resin containing the structure represented by the formula (1) is synthesized by reacting a compound selected from a diamine, a bis(aminophenol), 2,4-diaminophenol or the like having the structure of X, and a compound selected from a tetracarboxylic anhydride, a trimellitic anhydrate, a dicarboxylic acid, a dicarboxylic dichloride, a dicarboxylic acid

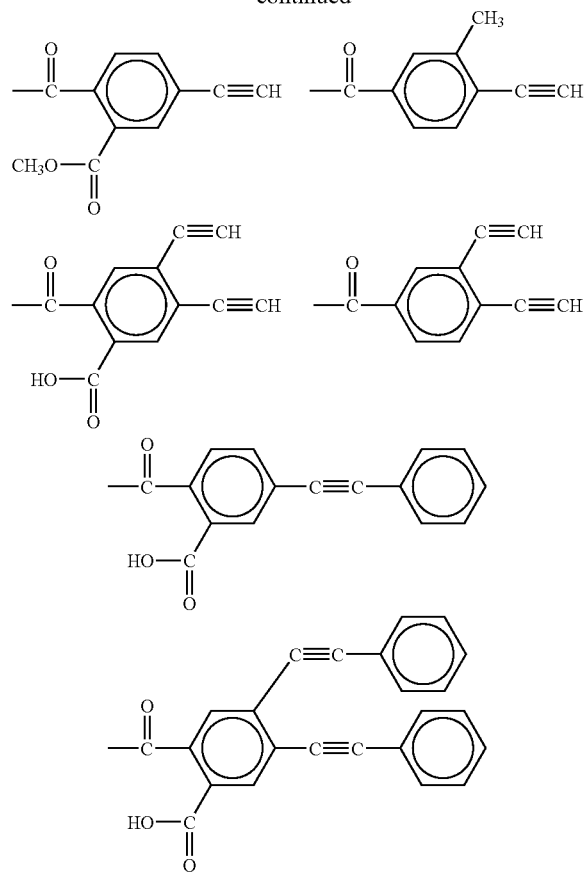

A particularly preferable group among these is selected from:

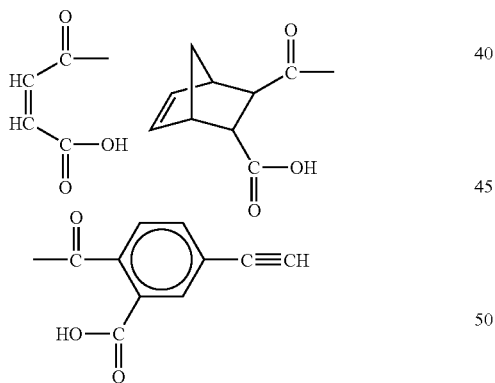

Two or more kinds of compounds capping a terminal may be used. It is not limited to the above mentioned means, but an acid group located at a terminal of the polyamide resin can be capped with an amine derivative containing an aliphatic group or a cyclic compound group having at least one of an alkenyl group or an alkynyl group so that an amide is obtained.

A positive-working photosensitive resin composition of the present invention comprises the polyamide resin (A) of the present invention having the structure represented by the formula (1), wherein about 0.1 mol % to about 30 mol % of the total amount of Y in the formula (1) has the structure represented by the formula (2), and a photosensitive diazoquinone compound (B).

The diazoquinone compound (B) used in the present invention is a compound having a 1,2-benzoquinonediazide or 1,2-naphthoquinonediazide structure, which is a well-known material disclosed by U.S. Pat. Nos. 2,772,975, 2,797,213 and 3,669,658. There may be, for instance:

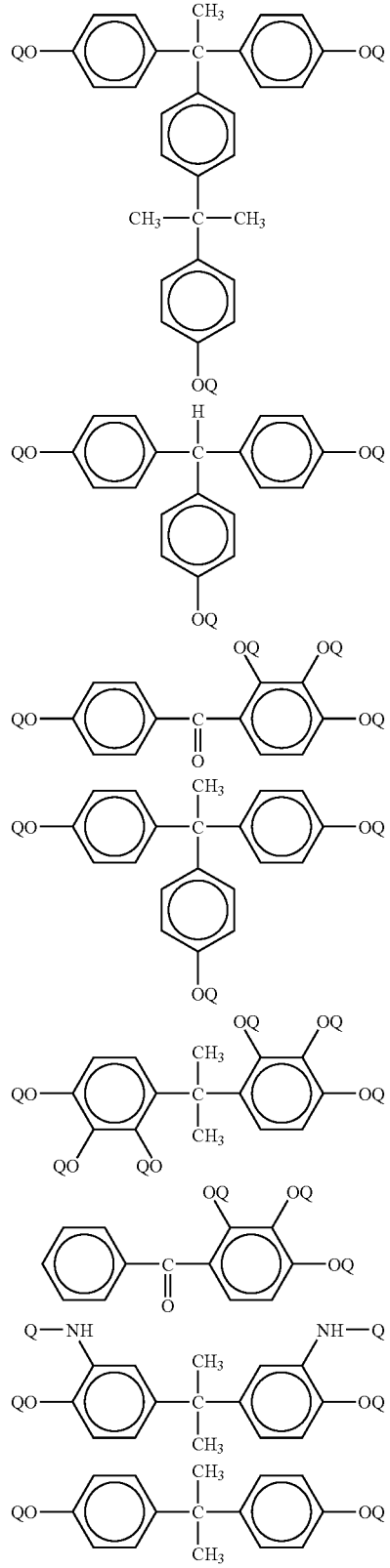

-continued

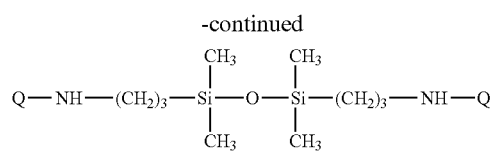

(In the formula, Q is hydrogen atom or selected from:

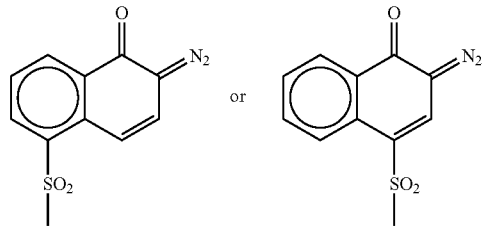

and in each compound at least one is:

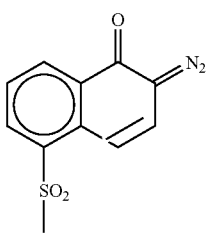 or 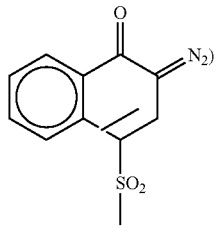

Among the abovementioned, particularly preferable diazoquinone compound (B) is an ester of phenol compound and 1,2-naphthoquinone-2-diazide-5-sulfonic acid or 1,2-naphtho quinone-2-diazide-4-sulfonic acid. There may be examples as follows but may not be limited and two or more kinds may be used:

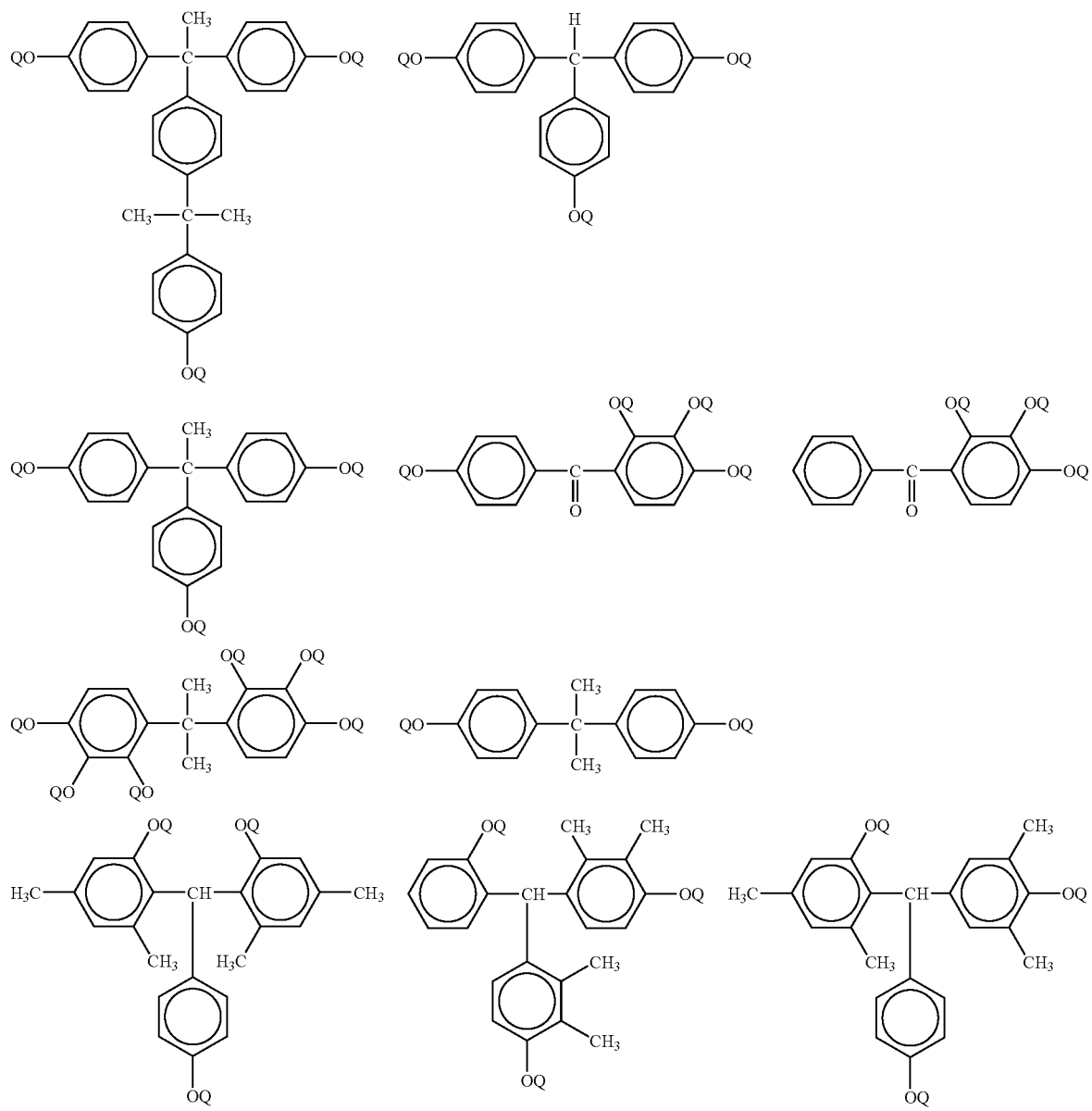

-continued
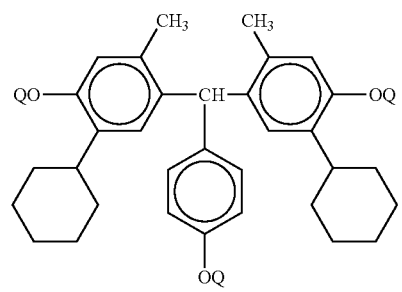
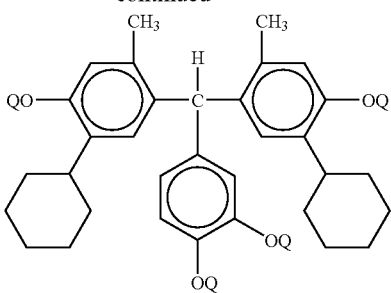
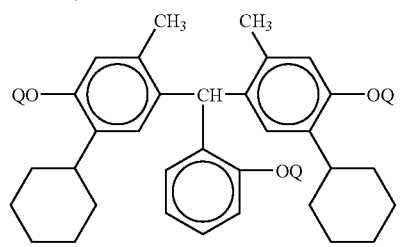
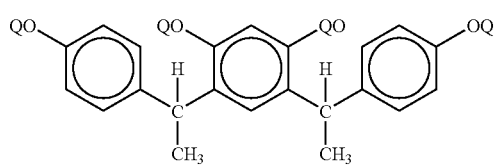
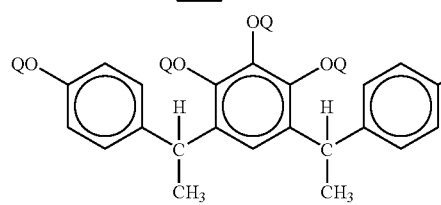
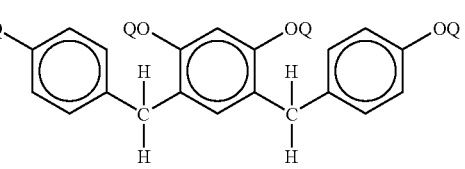
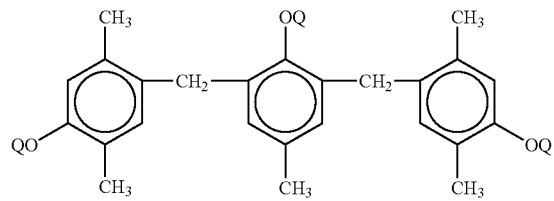
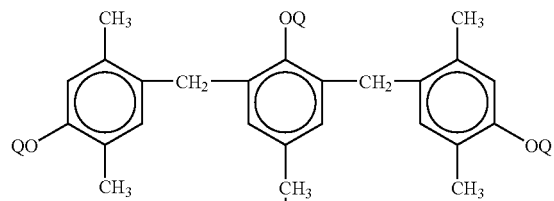
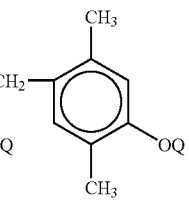
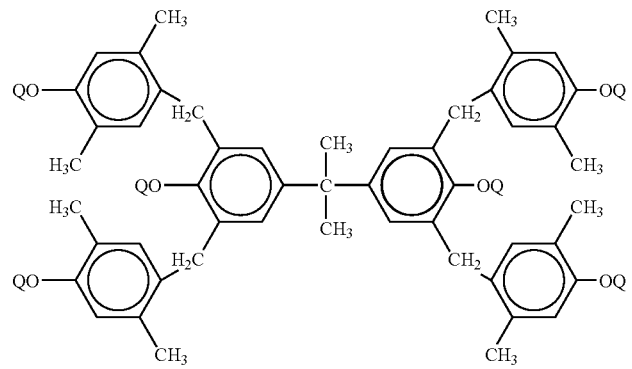
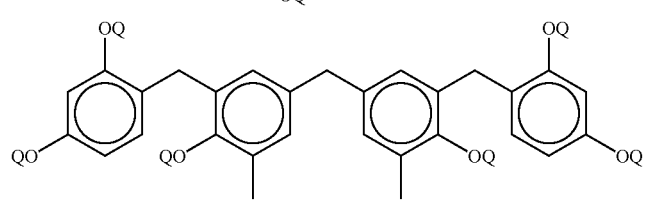

-continued
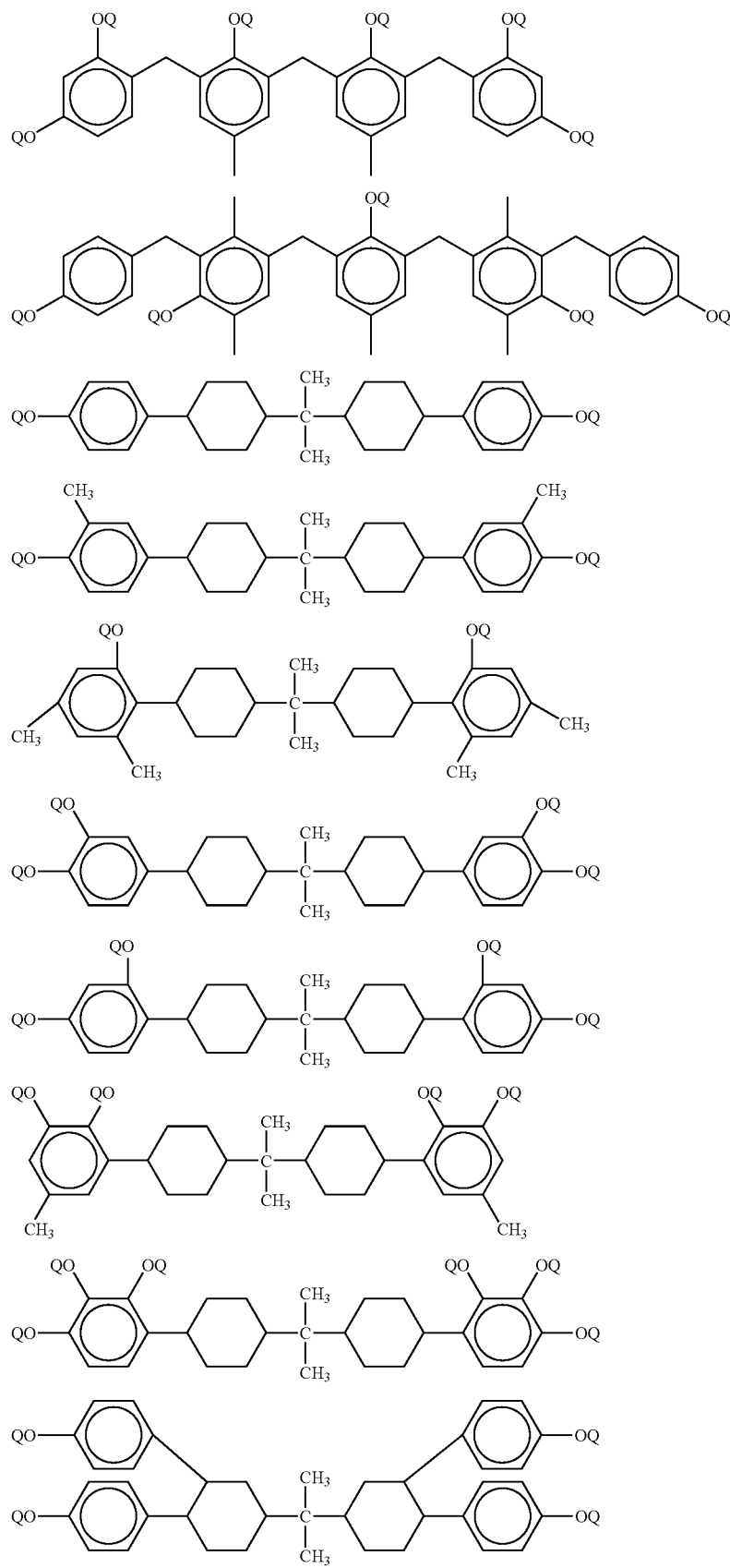

-continued

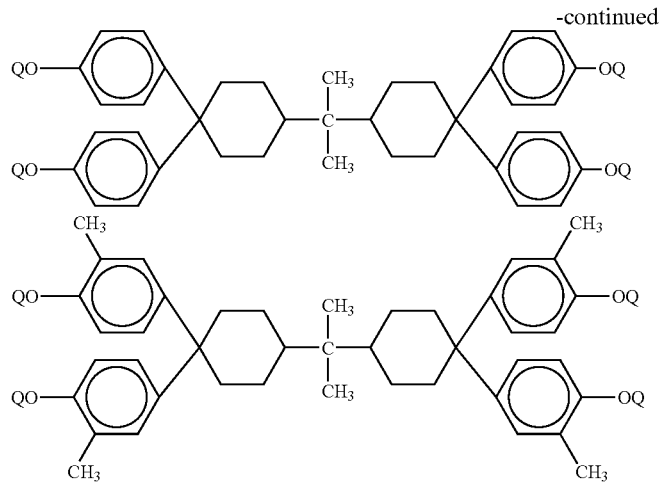

(In the formula, Q is hydrogen atom or selected from:

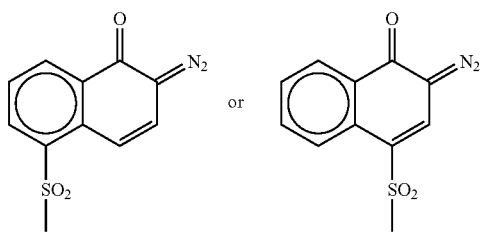

and in each compound at least one is:

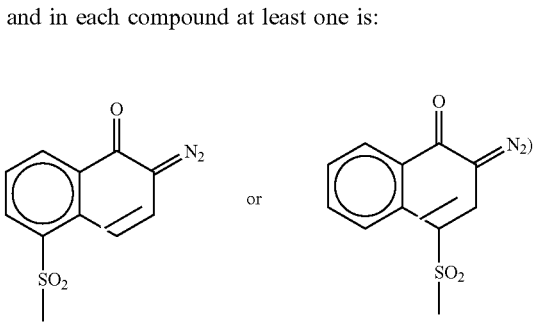

The compounding amount of the photosensitive diazoquinone compound (B) of the present invention is preferably 1 to 50 parts by weight to 100 parts by weight of the polyamide resin. If the amount of the diazoquinone compound (B) lowers 1 part by weight, a favorable pattern cannot be obtained. If the amount thereof exceeds 50 parts by weight, sensitivity may decrease significantly.

Further in the present invention, in order to enable high sensitivity and patterning at high resolution without scum upon development, a compound (C) containing a phenolic hydroxyl group is preferably used together.

The compounding amount of the compound containing a phenolic hydroxyl group is preferably 1 to 30 parts by weight to 100 parts by weight of the polyamide resin. A preferable phenolic compound may be represented by the formula (3):

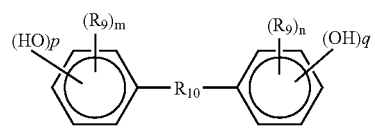

wherein, each of $R_8$ and $R_9$ is one group selected from a halogen atom, an alkyl group, an alkoxy group, an alkyl ester group, a cycloalkyl group and a cycloalkoxy group, wherein $R_8$ may be the same or different from each other, $R_9$ may be the same or different from each other, and $R_8$ and $R_9$ may be the same or different from each other; m is an integer of 0 to 5; n is an integer of 0 to 5; p is an integer of 0 to 3, q is an integer of 0 to 3, and $p+q \geq 2$; $R_{10}$ is one group selected from a single bond, a methylene group, an alkylene group, an oxygen atom, a carbonyl group, a carbonyl ether group, a sulfur atom, a sulfonyl group and an azo group.

A specific structure of the formula (3) may be as follows, but may not be limited.

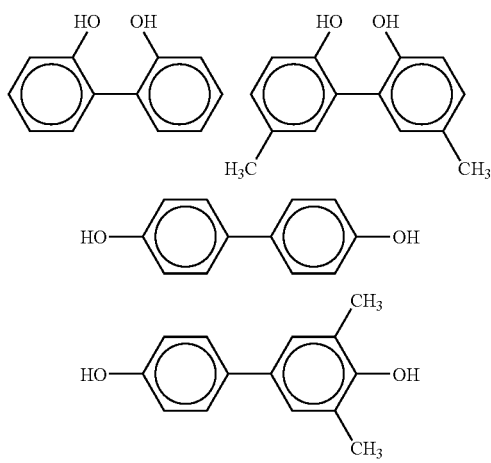

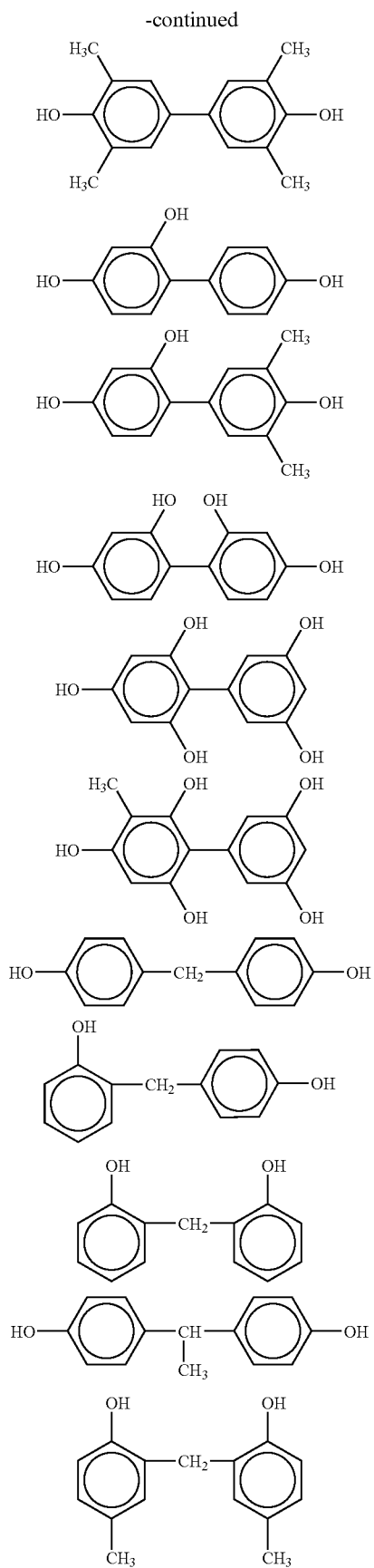
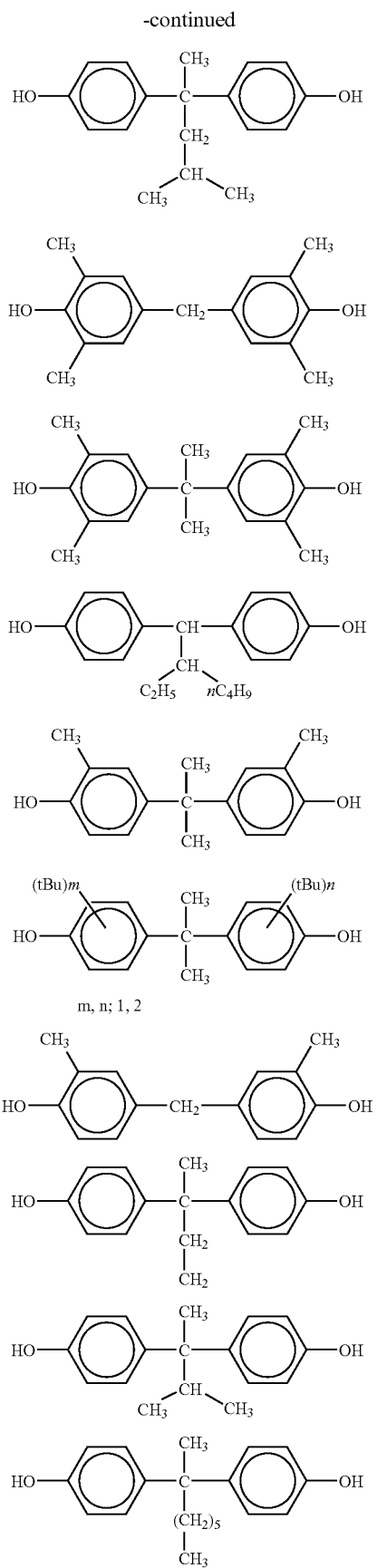

-continued
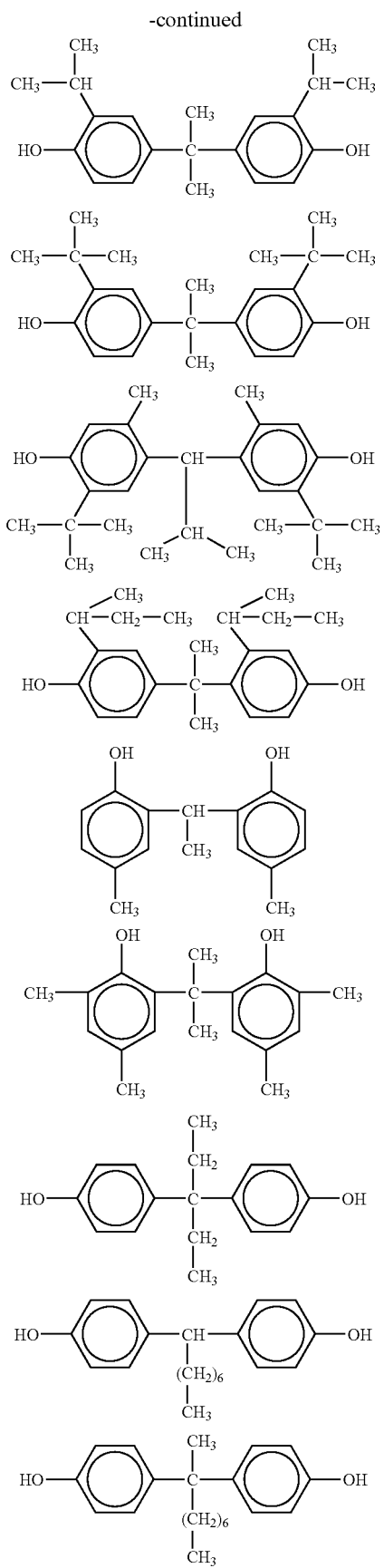
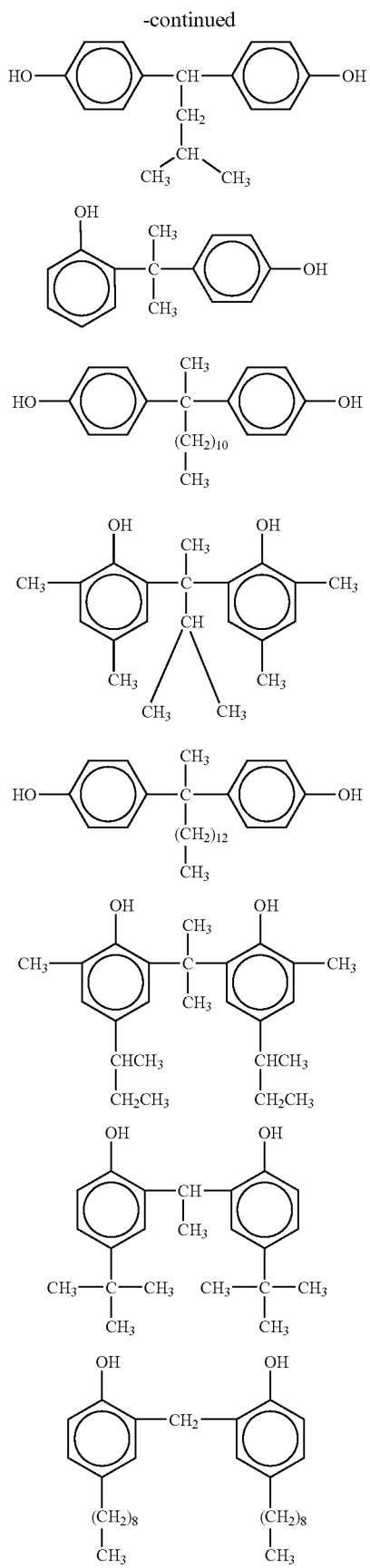

-continued
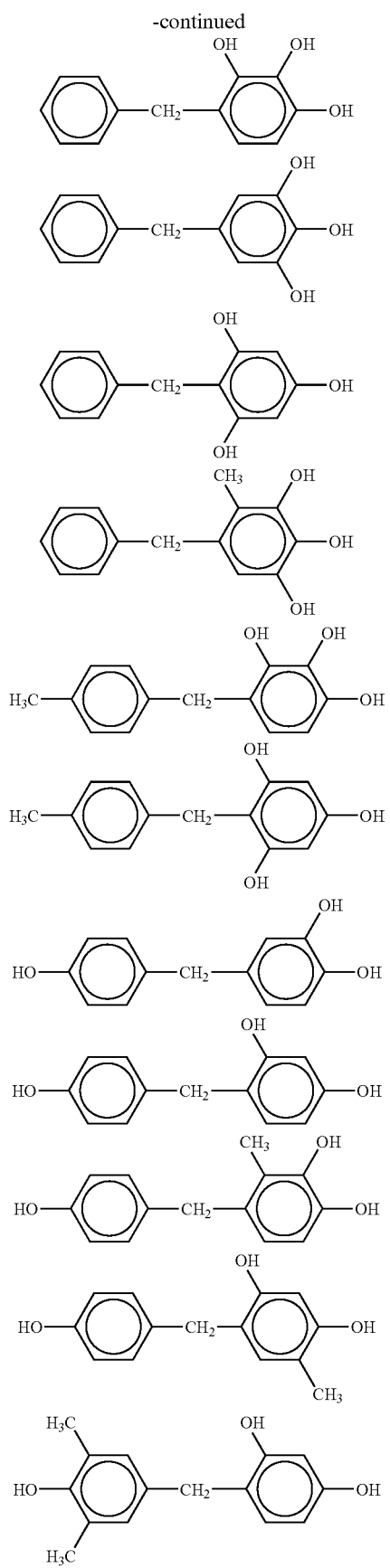
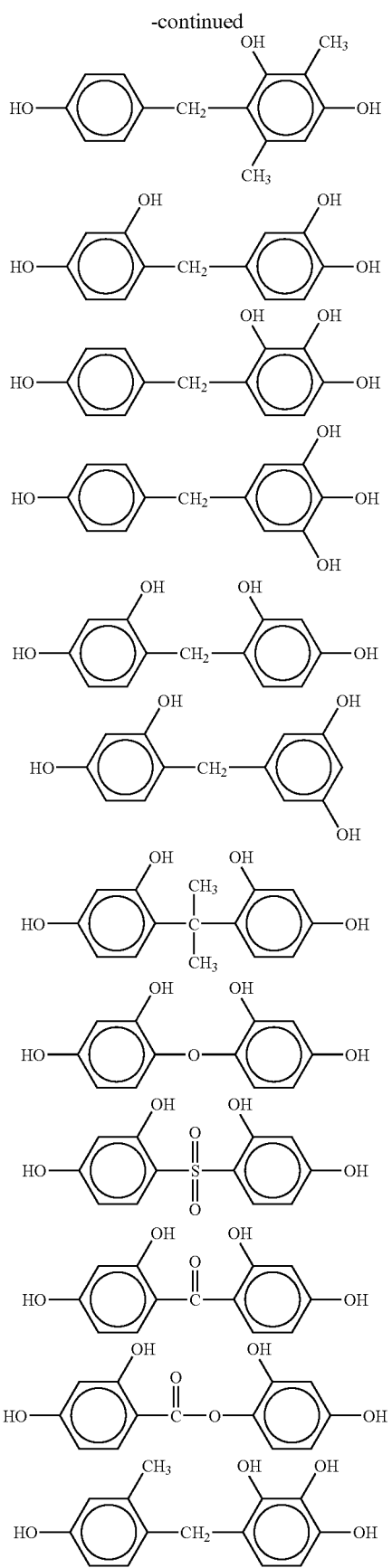

Preferable compound (C) containing a phenolic hydroxyl group among them is selected from:

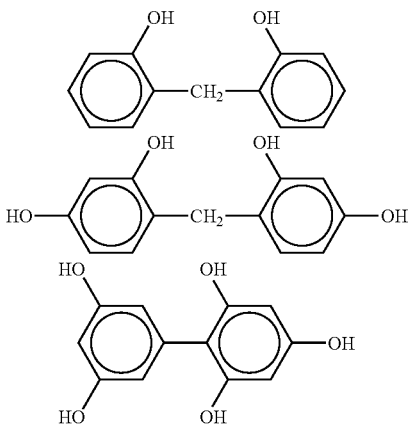

The polyamide resin of the present invention is dissolved in a solvent and used in a state of varnish. The solvent used includes N-methyl-2-pyrrolidone, γ-butyrolactone, N,N-dimethylacetamide, dimethyl sulfoxide, diethylene glycol dimethyl ether, diethylene glycol diethyl ether, diethylene glycol dibutyl ether, propyrene glycol monomethyl ether, dipropyrene glycol monomethyl ether, propyrene glycol monomethyl ether acetate, methyl lactate, ethyl lactate, butyl lactate, methyl-1,3-butylene glycol acetate, 1,3-butylene glycol-3-monomethyl ether, methyl pyruvate, ethyl pyruvate, methyl-3-methoxy propionate or the like, and may be used solely or in a mixture.

With regard to a method for using the positive-working photosensitive resin composition of the present invention, first, said composition is coated on a suitable base material, for instance, a silicon wafer, a ceramic substrate, an aluminum substrate or the like. An amount to be coated is determined so that a final thickness of a coating film after heating becomes about 0.1 μm to about 50 μm in the case of a semiconductor device, more preferably about 0.1 μm to about 30 μm. If film thickness is below about 0.1 μm, it is difficult to fully exert a function as a surface protective film for a semiconductor element, and if the thickness exceeds about 50 μm, not only makes it difficult to obtain a finely processed pattern but to lower throughput due to a prolonged processing time. A method for coating includes a spin coating using a spinner, a spray coating using a spray coater, a dipping, a printing, a roll coating or the like.

Secondly, the coating film is dried by prebaking at 60 to 130° C. to form a composition layer and thereafter irradiated with an active energy ray in a desired pattern form. An active energy ray refers to an energy ray including electromagnetic wave, radiation or energy ray having an intermediate property between them. An active energy ray to be used includes X-ray, electron beam, ultraviolet ray, visible ray or the like, and has preferably a wavelength of 200 to 500 nm.

Next, a postbaking process may follow. The postbaking process is performed at 60 to 150° C. for 10 seconds to 30 minutes. For heating, a hotplate, a simple oven, a diffusing furnace or the like may be used.

Thirdly, the exposed area is removed by contacting and dissolving with a developing solution to form a relief pattern. A developing solution to be suitably used includes an aqueous solution of alkalis such as inorganic alkalis such as sodium hydroxide, potassium hydroxide, sodium carbonate, sodium silicate, sodium metasilicate, aqueous ammonia or the like; primary amines such as ethylamine, n-propylamine or the like; secondary amines such as diethylamine, di-n-propylamine or the like; tertiary amines such as triethylamine, methyldiethylamine or the like; alcohol amines such as dimethyl ethanol amine, triethanol amine or the like; a quaternary ammonium salt such as tetramethylammonium hydroxide, tetraethylammonium hydroxide or the like; or an aqueous solution obtained by adding a suitable amount of a water-soluble organic solvent, for example, an alcohol such as methanol or ethanol or a surfactant to the above aqueous solution of alkalis. As a method for developing, those such as spraying, paddling, dipping, supersonic methods or the like can be used.

Subsequently, the relief pattern formed by development is rinsed. Ion-exchange water or distilled water is used for rinsing.

Then, a heat treatment is applied, thereby, the amide resin of the present invention forms an oxazole ring and/or an imide ring to obtain a final pattern of high heat resistance The present invention can form a pattern-formed resin film with high performance on a substrate by using the photosensitive resin composition of the present invention. As examples of application of the composition to make best use of its feature, there are a semiconductor device and a display device.

A specific example of the resin film using said photosensitive resin composition for a semiconductor device includes a passivation film and a buffer coating film formed on a semiconductor element, and an interlayer insulation film or the like formed on a circuit located on a semiconductor element.

A specific example of the resin film using said photosensitive resin composition for a display device includes an interlayer insulation film for TFT (Thin Film Transistor) element, a leveling film for TFT element, a leveling film for a color filter, a protrusion for MVA (Multi-domain Vertical Alignment) type liquid crystal display device, a liquid crystal alignment layer for a liquid crystal display device, a cathode partition for an organic EL device, an insulation film for an organic EL device or the like. The photosensitive resin composition for a display device is similarly used as for a semiconductor. On a certain location where said resin film or the like is formed on a substrate for a display device, a pattern-formed layer made of cured product of the photosensitive resin composition is formed by the above-mentioned means. High transparency is required for the resin film for a display device, particularly an interlayer insulation film and a leveling film. In such cases, introducing a postexposure process as mentioned in Example at the time of forming a layer made of cured product of the photosensitive resin composition is significantly preferable for practical use since a resin film excellent in transparency can be obtained.

The semiconductor device and the display device of the present invention may not be limited except that they are produced using said polyamide resin or said photosensitive resin composition or have a layer made of cured product of the composition, can be of various structures and be produced by conventionally known production methods.

Among them, as an application example using the photosensitive resin composition of the present invention for the semiconductor device, an application to a semiconductor device having a bump will be described with reference to figures. FIG. 1 is an enlarged cross-sectional view showing a pad portion of a semiconductor device having a bump of the present invention. As shown in FIG. 1, a passivation film 3 is formed on an Al pad 2 for input and output formed on a silicon wafer 1, and a via hole is formed on the passivation film 3. Further, thereon is formed an insulation protective film (a buffer coating film) 4 made of cured product of the photosensitive resin composition of the present invention, on which a metal (Cr, Ti or the like) film 5 is formed so that the metal film 5 is connected to the Al pad 2. The metal film 5 is etched as to leave surrounding area from the via hole to a solder bump 9 in order to insulate between each pad. A wiring 6 is formed on the insulated pad by plating or the like, and thereon is formed an insulation film 7 made of cured product of the photosensitive resin composition of the present invention. In the via hole formed by photolithography, a barrier metal 8 and the solder bump 9 are formed. A highly reliable semiconductor device can be provided as the film formed by using the photosensitive resin composition of the present invention is excellent in resistance to hydrofluoric acid and development property.

The positive-working photosensitive resin composition of the present invention is useful not only for the semiconductor and the display device, but also for an interlayer insulation for a multilayered circuit, a cover coating for a flexible cupperclad plate, a solder resist film, a liquid crystal alignment layer or the like.

In this way, according to the present invention, a polyamide resin which aims to provide a polybenzoxazole resin, a polyimide resin or a copolymer resin thereof excellent in resistance to hydrofluoric acid, a positive-working photosensitive resin composition excellent in resistance to hydrofluoric acid and development property using the polyamide resin, a method for producing a pattern-formed resin film using the composition, a semiconductor device and a display device using the composition, and a method for producing the semiconductor device and the display device can be provided.

EXAMPLE

Example 1

[Synthesis of a Polyamide Resin]

0.016 mol of a mixture of dicarboxylic acid derivative obtained by reacting 3.31 g (0.0128 mol) of diphenylether-4,4'-dicarboxylic acid, 0.98 g (0.0032 mol) of dicarboxylic acid having a structure represented by the formula (D-1) below and 4.32 g (0.032 mol) of 1-hydroxy-1,2,3-benzotriazole, and 7.33 g (0.020 mol) of hexafluoro-2,2-bis(3-amino-4-hydroxy phenyl)propane were charged in a four-necked separable flask equipped with a thermometer, an agitator, a feed inlet and a dry nitrogen gas inlet tube. N-methyl-2-pyrrolidone of 57.0 g was added for dissolution.

The thus obtained mixture was then reacted at 75° C. in an oil bath for 12 hours. 1.31 g (0.008 mol) of 5-norbornene-2,3-dicarboxylic anhydride dissolved in 7 g of N-methyl-2-pyrrolidone was then added to the above mixture, and they were reacted for another 12 hours while stirring. After reaction, the reaction mixture was filtered. The filtrate was poured into a solution of water/methanol of 3/1 (volume ratio) and a precipitate was formed. The precipitate was collected by filtration, rinsed sufficiently with water and then dried under vacuum to obtain a desired polyamide resin (A-1).

[Production of a Resin Composition]

The synthesized polyamide resin (A-1) of 10 g and 2 g of a photosensitive diazoquinone having a structure represented by the formula (B-1) below were dissolved in 70 g of γ-butyrolactone and then filtrated using a 0.2 µm filter made of a fluorocarbon resin to obtain a positive-working photosensitive resin composition.

[Evaluation of Development Properties]

The obtained positive-working photosensitive resin composition was coated on a silicon wafer using a spincoater and then dried at 120° C. for 4 minutes using a hotplate to obtain a coating film of about 10 µm thickness. The coating film was exposed through a mask manufactured by TOPPAN PRINTING CO., LTD. (Test Chart No. 1: patterns for remaining and patterns for removing of 0.88 to 50 µm width are depicted) using an i-line stepper NSR-4425i manufactured by Nicon Corp., with various exposure amounts from 200 mJ/cm² increased by 10 mJ/cm² each.

The coating film was rinsed with pure water for 30 seconds after the exposed area of the composition was dissolved and removed by dipping in a 2.38% aqueous solution of tetramethylammonium hydroxide for 80 seconds. As a result of observing pattern, it was confirmed that a portion to be opened in the pattern was preferably formed to the extent of 7 µm at the exposure amount of 500 mJ/cm². The obtained pattern was then cured in a clean oven at 150° C. for 30 minutes and at 320° C. for 30 minutes under a condition of an oxygen concentration of 1,000 ppm or less. Then, the cured wafer was dipped in a 1% solution of hydrofluoric acid for 15 minutes at room temperature, however, peeling of the pattern was not observed.

Comparative Example 3

[Synthesis of a Polyamide Resin]

A polyamide resin (A-2) was synthesized similarly as in Example 1 except that 2.48 g (0.0096 mol) of diphenylether-4,4'-dicarboxylic acid and 1.96 g (0.0064 mol) of dicarboxylic acid having a structure represented by (D-1) below are used instead of 3.31 g (0.0128 mol) of diphenylether-4,4'-dicarboxylic acid and 0.98 g (0.0032 mol) of dicarboxylic acid having a structure represented by the formula (D-1) below in the polyamide resin synthesis in Example 1.

[Production of a Resin Composition and Evaluation of Development Properties]

A positive-working photosensitive resin composition was formed and evaluated similarly as in Example 1 using the synthesized polyamide resin (A-2). As a result, it was confirmed that a portion to be opened in the pattern of was preferably formed to the extent of 8 µm at the exposure amount of 520 mJ/cm² for developing time of 80 seconds. The obtained pattern was then cured in a clean oven at 150° C. for 30 minutes and at 320° C. for 30 minutes under a condition of an oxygen concentration of 1,000 ppm or less. Then, the cured wafer was dipped in a 1% solution of hydrofluoric acid for 15 minutes at room temperature, however, peeling of the pattern was not observed.

Example 3

[Synthesis of a Polyamide Resin]

A polyamide resin (A-3) was synthesized similarly as in Example 1 except that 1.20 g (0.0032 mol) of dicarboxylic acid having a structure represented by the formula (D-2) below is used instead of 0.98 g (0.0032 mol) of dicarboxylic acid having a structure represented by the formula (D-1) below in the polyamide resin synthesis in Example 1.

[Production of a Resin Composition and Evaluation of Development Properties]

The synthesized polyamide resin (A-3) of 10 g and 1.5 g of a photosensitive diazoquinone having a structure represented by the formula (B-2) below were dissolved in 70 g of γ-butyrolactone and then filtrated using a 0.2 µm filter made of a fluorocarbon resin to obtain a positive-working photosensitive resin composition.

As a result of evaluation, it was confirmed that a portion to be opened in the pattern was preferably formed to the extent of 7 µm at the exposure amount of 480 mJ/cm² for developing time of 80 seconds. The obtained pattern was then cured in a clean oven at 150° C. for 30 minutes and at 320° C. for 30 minutes under a condition of an oxygen concentration of 1,000 ppm or less. Then, the cured wafer was dipped in a 1% solution of hydrofluoric acid for 15 minutes at room temperature, however, peeling of the pattern was not observed.

Example 4

[Synthesis of a Polyamide Resin]

4,4'-oxydiphthalic anhydride of 6.82 g (0.022 mol), 14.08 g (0.033 mol) of acid anhydride having a structure represented by the formula. (D-3) below, 13.0 g (0.110 mol) of 2-methyl-2-propanol, and 10.9 g (0.138 mol) of pyridine were charged in a four-necked separable flask equipped with a thermometer, an agitator, a feed inlet and a dry nitrogen gas inlet tube. 150 g of N-methyl-2-pyrrolidone was added for dissolution. After 14.9 g (0.110 mol) of 1-hydroxy-1,2,3-benzotriazole and 30 g of N-methyl-2-pyrrolidone were dropped in the reacted solution, 22.7 g (0.110 mol) of dicyclohexylcarbodiimide and 50 g of N-methyl-2-pyrrolidone were dropped in the above solution, and they were reacted at room temperature overnight.

Subsequently, 27.1 g (0.055 mol) of a dicarboxylic acid derivative (activated ester) obtained by reacting 1 mol of diphenylether-4,4'-dicarboxylic acid and 2 mol of 1-hydroxy-1,2,3-benzotriazole, 44.8 g (0.122 mol) of hexafluoro-2,2-bis(3-amino-4-hydroxyphenyl)propane and 70 g of N-methyl-2-pyrrolidone were added to the above reacted solution, and they were stirred at room temperature for 2 hours. Then, the above mixture was reacted at 75° C. in an oil bath for 12 hours. A desired polyamide resin (A-4) was obtained similarly as in Example 1 except the above.

[Production of a Resin Composition and Evaluation of Development Properties]

The synthesized polyamide resin (A-4) of 10 g and 2.0 g of a photosensitive diazoquinone having a structure represented by the formula (B-1) below were dissolved in 70 g of γ-butyrolactone and then filtrated using a 0.2 µm filter made of a fluorocarbon resin to obtain a positive-working photosensitive resin composition.

As a result of evaluation, it was confirmed that a portion to be opened in the pattern was preferably formed to the extent of 8 µm at the exposure amount of 520 mJ/cm² for developing time of 70 seconds. The obtained pattern was then cured in a clean oven at 150° C. for 30 minutes and at 320° C. for 30 minutes under a condition of an oxygen concentration of 1,000 ppm or less. Then, the cured wafer was dipped in a 1% solution of hydrofluoric acid for 15 minutes at room temperature, however, peeling of the pattern was not observed.

A positive-working photosensitive resin composition was prepared by adding a compound (C) containing a phenolic hydroxyl group to the process of preparing the positive-working photosensitive resin compositions in Examples 1 to 4, and evaluated as follows.

Example 5

[Production of a Resin Composition and Evaluation of Development Properties]

The polyamide resin (A-1) obtained in Example 1 of 10 g, 2 g of a photosensitive diazoquinone having a structure represented by the formula (B-1) below and 1.5 g of a compound (C-1) containing a phenolic hydroxyl group were dissolved in 70 g of γ-butyrolactone and then filtrated using a 0.2 μm filter made of a fluorocarbon resin to obtain a positive-working photosensitive resin composition. As a result of evaluation similarly as in Example 1, it was confirmed that a portion to be opened in the pattern was preferably formed to the extent of 3 μm at the exposure amount of 420 mJ/cm$^2$ for developing time of 50 seconds. The obtained pattern was then cured in a clean oven at 150° C. for 30 minutes and at 320° C. for 30 minutes under a condition of an oxygen concentration of 1,000 ppm or less. Then, the cured wafer was dipped in a 1% solution of hydrofluoric acid for 15 minutes at room temperature, however, peeling of the pattern was not observed.

Comparative Example 4

[Production of a Resin Composition and Evaluation of Development Properties]

The polyamide resin (A-2) obtained in Example 2 of 10 g, 2 g of a photosensitive diazoquinone having a structure represented by the formula (B-1) below and 0.5 g of a compound (C-2) containing a phenolic hydroxyl group were dissolved in 70 g of γ-butyrolactone and then filtrated using a 0.2 μm filter made of a fluorocarbon resin to obtain a positive-working photosensitive resin composition.

As a result of evaluation similarly as in Example 1, it was confirmed that a portion to be opened in the pattern was preferably formed to the extent of 4 μm at the exposure amount of 400 mJ/cm$^2$ for developing time of 40 seconds. The obtained pattern was then cured in a clean oven at 150° C. for 30 minutes and at 320° C. for 30 minutes under a condition of an oxygen concentration of 1,000 ppm or less. Then, the cured wafer was dipped in a 1% solution of hydrofluoric acid for 15 minutes at room temperature, however, peeling of the pattern was not observed.

Example 7

[Production of a Resin Composition and Evaluation of Development Properties]

The polyamide resin (A-3) obtained in Example 3 of 10 g, 1.5 g of a photosensitive diazoquinone having a structure represented by the formula (B-2) below and 1.0 g of a compound (C-3) containing a phenolic hydroxyl group were dissolved in 70 g of γ-butyrolactone and then filtrated using a 0.2 μm filter made of a fluorocarbon resin to obtain a positive-working photosensitive resin composition.

As a result of evaluation similarly as in Example 1, it was confirmed that a portion to be opened in the pattern was preferably formed to the extent of 3 μm at the exposure amount of 430 mJ/cm$^2$ for developing time of 40 seconds. The obtained pattern was then cured in a clean oven at 150° C. for 30 minutes and at 320° C. for 30 minutes under a condition of an oxygen concentration of 1,000 ppm or less. Then, the cured wafer was dipped in a 1% solution of hydrofluoric acid for 15 minutes at room temperature, however, peeling of the pattern was not observed.

Example 8

[Production of a Resin Composition and Evaluation of Development Properties]

The polyamide resin (A-4) obtained in Example 4 of 10 g, 2.0 g of a photosensitive diazoquinone having a structure represented by the formula (B-1) below and 1.5 g of a compound (C-1) containing a phenolic hydroxyl group were dissolved in 70 g of γ-butyrolactone and then filtrated using a 0.2 μm filter made of a fluorocarbon resin to obtain a positive-working photosensitive resin composition.

As a result of evaluation similarly as in Example 1, it was confirmed that a portion to be opened in the pattern was preferably formed to the extent of 3 μm at the exposure amount of 430 mJ/cm$^2$ for developing time of 40 seconds. The obtained pattern was then cured in a clean oven at 150° C. for 30 minutes and at 320° C. for 30 minutes under a condition of an oxygen concentration of 1,000 ppm or less. Then, the cured wafer was dipped in a 1% solution of hydrofluoric acid for 15 minutes at room temperature, however, peeling of the pattern was not observed.

Comparative Example 1

[Synthesis of a Polyamide Resin]

0.016 mol of a mixture of dicarboxylic acid derivative obtained by reacting 4.13 g (0.016 mol) of diphenylether-4,4'-dicarboxylic acid and 4.32 g (0.032 mol) of 1-hydroxy-1,2,3-benzotriazole, and 7.33 g (0.020 mol) of hexafluoro-2,2-bis (3-amino-4-hydroxy phenyl)propane were charged in a four-necked separable flask equipped with a thermometer, an agitator, a feed inlet and a dry nitrogen gas inlet tube. N-methyl-2-pyrrolidone of 57.0 g was added for dissolution. Then, the above mixture was reacted at 75° C. in an oil bath for 12 hours. 1.31 g (0.008 mol) of 5-norbornene-2,3-dicarboxylic anhydride dissolved in 7 g of N-methyl-2-pyrrolidone was then added to the above mixture, and they were reacted for another 12 hours while stirring. After reaction, the reaction mixture was filtered. The filtrate was poured into a solution of water/methanol of 3/1 (volume ratio) and a precipitate was formed. The precipitate was collected by filtration, rinsed sufficiently with water and then dried under vacuum to obtain a desired polyamide resin (A-5).

[Production of a Resin Composition]

The synthesized polyamide resin (A-5) of 10 g, 2 g of a photosensitive diazoquinone having a structure represented by the formula (B-1) below and 0.5 g of γ-glycidoxypropyl trimethoxy silane as a silane coupling agent were dissolved in 50 g of N-methyl-2-pyrrolidone and then filtrated using a 0.2 μm filter made of a fluorocarbon resin to obtain a positive-working photosensitive resin composition.

[Evaluation of Development Properties]

As a result of evaluation similarly as in Example 1, it was confirmed that a portion to be opened in the pattern was preferably formed to the extent of 7 μm at the exposure amount of 500 mJ/cm$^2$ for developing time of 80 seconds. The obtained pattern was then cured in a clean oven at 150° C. for 30 minutes and at 320° C. for 30 minutes under a condition of an oxygen concentration of 1,000 ppm or less.

Then, the cured wafer was dipped in a 1% solution of hydrofluoric acid at room temperature. After dipping for about 7 minutes, peeling of the pattern was observed.

Comparative Example 2

[Production of a Resin Composition and Evaluation of Development Properties]

The polyamide resin (A-5) obtained in Comparative Example 1 of 10 g, 2 g of a photosensitive diazoquinone having a structure represented by the formula (B-1) below, 0.5 g of a compound (C-2) containing a phenolic hydroxyl group and 0.5 g of γ-glycidoxypropyl trimethoxy silane as a silane coupling agent were dissolved in 70 g of N-methyl-2-pyrrolidone and then filtrated using a 0.2 μm filter made of a fluorocarbon resin to obtain a positive-working photosensitive resin composition.

As a result of evaluation similarly as in Example 1, it was confirmed that a portion to be opened in the pattern was preferably formed to the extent of 3 μm at the exposure amount of 420 mJ/cm$^2$ for developing time of 50 seconds. The obtained pattern was then cured in a clean oven at 150° C. for 30 minutes and at 320° C. for 30 minutes under a condition of an oxygen concentration of 1,000 ppm or less. Then, the cured wafer was dipped in a 1% solution of hydrofluoric acid at room temperature. After dipping for about 9 minutes, peeling of the pattern was observed.

B-1:

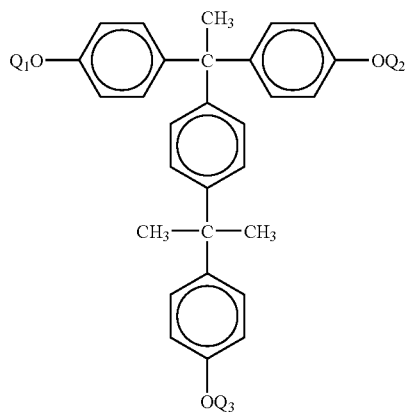

(In the formula, 75% of Q1, Q2, Q3 is:

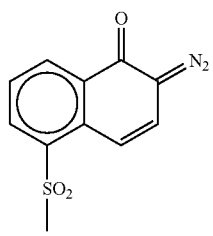

and 25% thereof is hydrogen atom)

B-2:

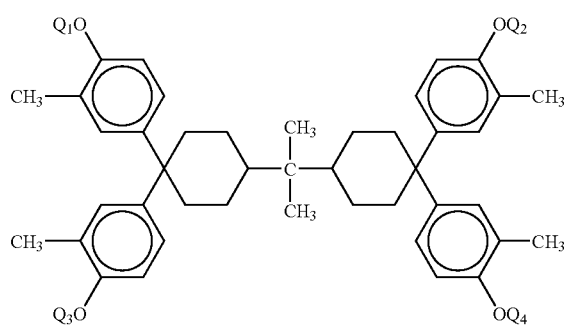

(In the formula, 87.5% of Q1, Q2, Q3, Q4 is:

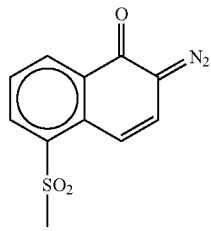

and 12.5% thereof is hydrogen atom)

C-1:

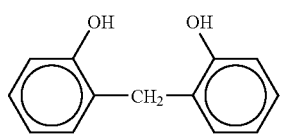

C-2:

![C-2 structure: biphenyl with multiple OH groups]

C-3:

![C-3 structure: bisphenol methane with multiple OH groups]

D-1:

HOOC—(CH$_2$)$_3$—Si(CH$_3$)$_2$—O—Si(CH$_3$)$_2$—(CH$_2$)$_3$—COOH

D-2:

HOOC—[phenyl]—Si(CH$_3$)$_2$—O—Si(CH$_3$)$_2$—[phenyl]—COOH

D-3:

![D-3 structure: bis(phthalic anhydride) linked via disiloxane]

TABLE 1

|  | Polyamide (A) | | Photosensitive diazoquinone (B) | | Compound (C) containing phenolic hydroxyl group | | Sensitivity (mJ/cm$^2$) | Resolution (μm) | Resistance to hydrofluoric acid |
|---|---|---|---|---|---|---|---|---|---|
|  |  | Added amount (g) |  | Added amount (g) |  | Added amount (g) |  |  |  |
| Example 1 | A-1 | 10 | B-1 | 2.0 | — | — | 500 | 7 | No peeling after 15 minutes |
| Example 2 | A-2 | 10 | B-1 | 2.0 | — | — | 520 | 8 | No peeling after 15 minutes |
| Example 3 | A-3 | 10 | B-2 | 1.5 | — | — | 480 | 7 | No peeling after 15 minutes |
| Example 4 | A-4 | 10 | B-1 | 2.0 | — | — | 520 | 8 | No peeling after 15 minutes |
| Example 5 | A-1 | 10 | B-1 | 2.0 | C-1 | 1.5 | 420 | 3 | No peeling after 15 minutes |
| Example 6 | A-2 | 10 | B-1 | 2.0 | C-2 | 0.5 | 400 | 4 | No peeling after 15 minutes |
| Example 7 | A-3 | 10 | B-2 | 1.5 | C-3 | 1.0 | 430 | 3 | No peeling after 15 minutes |
| Example 8 | A-4 | 10 | B-1 | 2.0 | C-1 | 1.5 | 430 | 3 | No peeling after 15 minutes |
| Comparative Example 1 | A-5 | 10 | B-1 | 2.0 | — | — | 500 | 7 | Peeling after 7 minutes |
| Comparative Example 2 | A-5 | 10 | B-1 | 2.0 | C-2 | 0.5 | 420 | 3 | Peeling after 9 minutes |

Example 9

[Production of Display Device and Evaluation of Characteristics]

An ITO film deposited and formed on a glass substrate was divided in stripe form by a usual photolithography method using a photoresist, on which a positive-working photosensitive resin composition obtained in Example 1 was coated to form a resin layer of about 2 μm thickness. Then, the above resin layer was subject to exposure through a glass musk at exposure strength of 25 mW/cm$^2$ for 10 seconds by a parallel exposure system (light source: high-pressure mercury-vapor lamp). Then, by dipping and developing the resin layer in a 2.38% aqueous solution of tetramethylammonium hydroxide for 20 seconds, a portion except an edge of each ITO on ITO in stripe form was exposed and a resin layer was formed only on the edge of ITO film and a portion wherein an ITO film was removed. Subsequently, the thus processed substrate was subject to postexposure on the whole resin layer at exposure strength of 25 mW/cm$^2$ for 40 seconds by the parallel exposure system used upon exposing, and heat-curing in the air at 250° C. for 1 hour by a hot-air circulating drier.

On this substrate, copper phthalocyanine as a positive hole injection layer and bis-N-ethylcarbazole as a positive hole transport layer were deposited under reduced pressure of 1×10$^{-4}$ Pa or less prior to depositing N,N'-diphenyl-N,N'-m-toluyl-4,4'-diamino-1,1'-biphenyl as a light emitting layer and tris(8-quinolinolate)aluminum as an electron injection layer thereon in this order. Further, after depositing and forming an aluminum layer as a second electrode thereon, the aluminum layer was divided in stripe form of a direction perpendicular to the stripe of said ITO film by a usual photolithography method using a photoresist. The substrate thus obtained was dried under reduced pressure and a glass plate for sealing was adhered using an epoxy based adhesive to obtain a display device. The display device was subject to sequential activation by applying voltage to both electrodes after processing at 80° C. for 250 hours, however, the display device emitted light without problem.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A polyamide resin comprising a structure represented by formula (1), wherein about 0.1 mol % to about 30 mol % of the total amount of Y in formula (1) has a structure represented by formula (2):

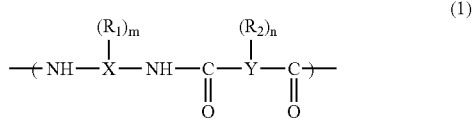

(1)

wherein, X is an organic group of 2 to 4 valences; Y is an organic group of 2 to 6 valences; $R_1$ is a hydroxyl group or —O—$R_3$, each of which may be the same or different from each other wherein m is an integer of 2; $R_2$ is a hydroxyl group or —O—$R_3$, each of which may be the same or different from each other wherein n is an integer of 0 to 4; $R_3$ is an organic group having 1 to 15 carbon atoms, at least one of $R_1$ is a hydroxyl group;

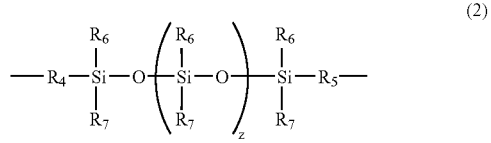

(2)

wherein, each of $R_4$ and $R_5$ is a divalent organic group, and may be the same or different from each other; each of $R_6$ and $R_7$ is a monovalent organic group, and may be the same or different from each other; z is an integer of 0 to 20.

2. A polyamide resin according to claim 1, wherein the structure represented by the formula (2) is a member selected from the group consisting of:

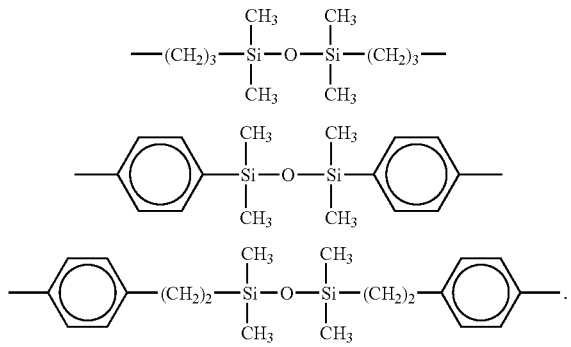

3. A positive-working photosensitive resin composition comprising a polyamide resin (A) having a structure represented by formula (1), wherein about 0.1 mol % to about 30 mol % of the total amount of Y in formula (1) has a structure represented by formula (2), and a photosensitive diazoquinone compound (B):

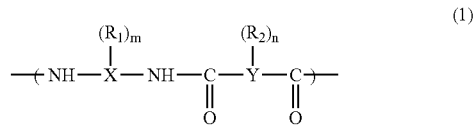

wherein, X is an organic group of 2 to 4 valences; Y is an organic group of 2 to 6 valences; $R_1$ is a hydroxyl group or —O—$R_3$, each of which may be the same or different from each other wherein m is an integer of 2; $R_2$ is a hydroxyl group, or —O—$R_3$, each of which may be the same or different from each other wherein n is an integer of 0 to 4; $R_3$ is an organic group having 1 to 15 carbon atoms, at least one of $R_1$ is a hydroxyl group;

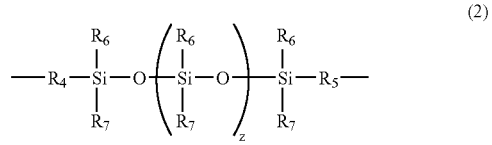

wherein, each of $R_4$ and $R_5$ is a divalent organic group, and may be the same or different from each other; each of $R_6$ and $R_7$ is a monovalent organic group, and may be the same or different from each other; z is an integer of 0 to 20.

4. A positive-working photosensitive resin composition according to claim 3, further comprising a compound (C) containing a phenolic hydroxyl group.

5. A positive-working photosensitive resin composition according to claim 4, wherein the compound (C) containing a phenolic hydroxyl group has the following structure:

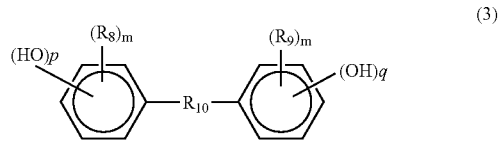

wherein, each of $R_8$ and $R_9$ is a member selected from the group consisting of a halogen atom, an alkyl group, an alkoxy group, an alkyl ester group, a cycloalkyl group and a cycloalkoxy group, wherein $R_8$ may be the same or different from each other, $R_9$ may be the same or different from each other, and $R_8$ and $R_9$ may be the same or different from each other; m is an integer of 0 to 5; n is an integer of 0 to 5; p is an integer of 0 to 3, q is an integer of 0 to 3, and p+q>2; $R_{10}$ is one group selected from the group consisting of a single bond, an alkylene group, a methylene group, an oxygen atom, a carbonyl group, a carbonyl ether group, a sulfur atom, a sulfonyl group and an azo group.

6. A method for producing a pattern-formed resin film, comprising: forming a composition layer by coating the positive-working photosensitive resin composition according to claim 3 on a substrate; forming a pattern by allowing the composition layer to be irradiated with an active energy ray and be in contact with a developing solution; and heating the composition.

7. A semiconductor device produced by applying a photosensitive resin composition comprising the polyamide resin according to claim 1 onto a semiconductor element so that a film thickness of the photosensitive resin composition becomes about 0.1 μm after heating followed by prebaking, exposing, developing and heating.

8. A semiconductor device produced by applying a photosensitive resin composition comprising the positive-working photosensitive resin composition according to claim 3 onto a semiconductor element so that a film thickness of the photosensitive resin composition becomes about 0.1 μm after heating followed by prebaking, exposing, developing and heating.

9. A display device produced by applying a photosensitive resin composition comprising the polyamide resin according to claim 1 onto a semiconductor element so that a film thickness of the photosensitive resin composition becomes about 0.1 μm after heating followed by prebaking, exposing, developing and heating.

10. A display device produced by applying a photosensitive resin composition comprising the positive-working photosensitive resin composition according to claim 3 onto a semiconductor element so that a film thickness of the photosensitive resin composition becomes about 0.1 μm after heating followed by prebaking, exposing, developing and heating.

11. A method for producing a semiconductor device wherein the semiconductor device is obtained by applying the positive-working photosensitive resin composition according to claim 3 on a semiconductor element so that a film thickness of the positive-working photosensitive resin composition becomes about 0.1 μm to about 50 μm after heating followed by prebaking, exposing, developing and heating.

12. method for producing a display device wherein the display device is obtained by applying the positive-working photosensitive resin composition according to claim 3 on a substrate for display device so that a film thickness of the positive-working photosensitive resin composition becomes about 0.1 μm to about 50 μm after heating followed by prebaking, exposing, developing and heating.

13. The polyamide resin according to claim 1, wherein each of $R_4$ and $R_5$ can be the same or different and is a member selected from the group consisting of straight chain hydrocarbon, branched chain hydrocarbon, cyclic hydrocarbon and combinations thereof, wherein the member of the group can contain a heteroatom and a hydrogen atom in the member can be substituted by a halogen.

14. The polyamide resin according to claim 1, wherein $R_4$ and $R_5$ can be the same or different and is a member selected from the group consisting of alkylene, arylene with an alkyl substituent, combination of alkylene and unsubstituted arylene, and combination of alkylene and arylene with an alkyl substituent.

15. The polyamide resin according to claim 1, wherein $R_6$ and $R_7$ can be the same or different and is at least one aliphatic and aromatic hydrocarbon, wherein the hydrocarbon can contain a heteroatom and a hydrogen atom in the hydrocarbon can be substituted by a halogen.

16. The polyamide resin according to claim 1, wherein $R_6$ and $R_7$ is at least one of alkyl, aryl and aralkyl.

17. The polyamide resin according to claim 1, wherein x is at least one of:

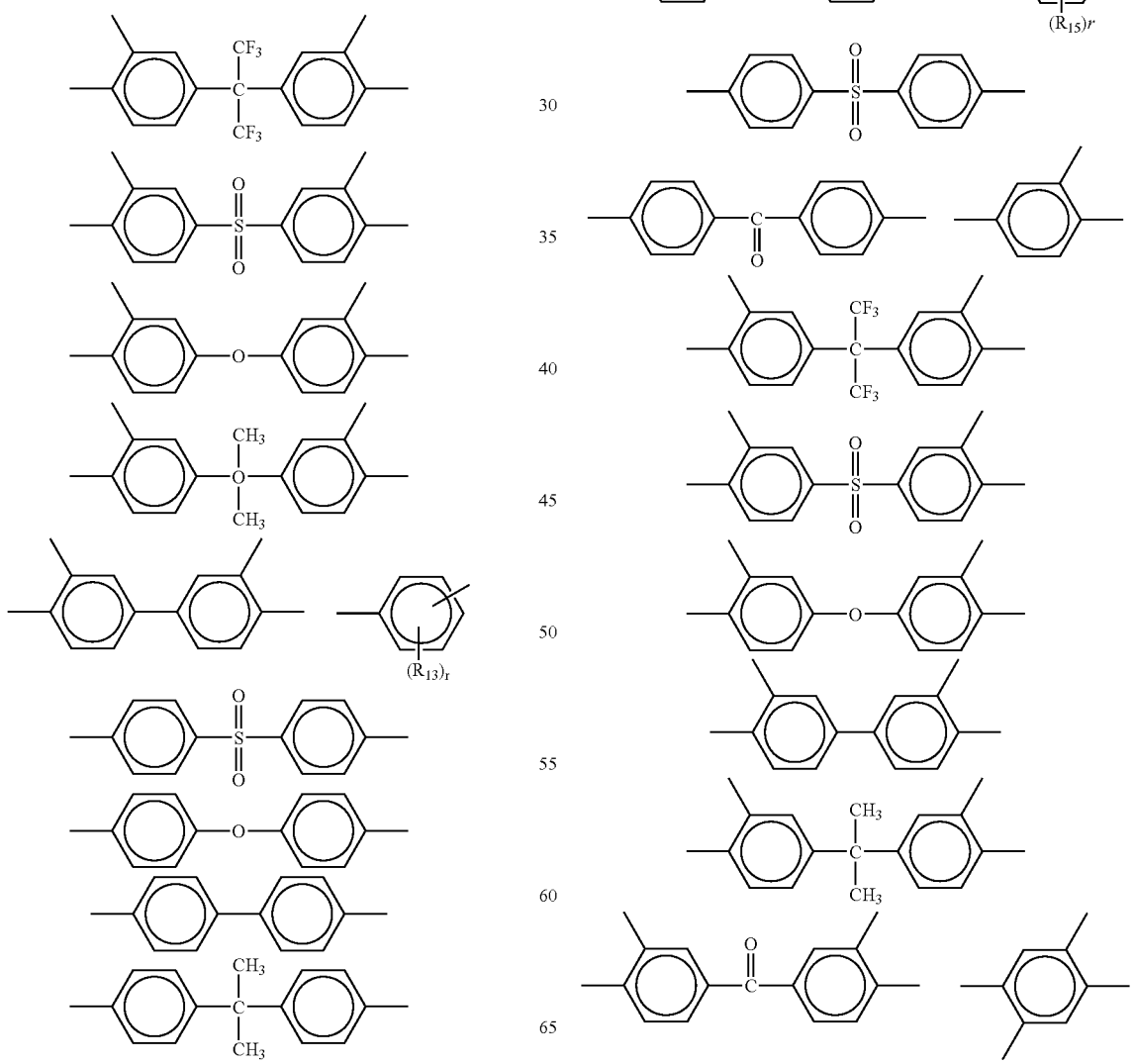

and wherein $R_{13}$ is selected from the group consisting of alkyl, alkyl ester, halogen and mixtures thereof, and r is an integer of 0 to 2.

18. The polyamide resin according to claim 1, wherein Y is at least one of:

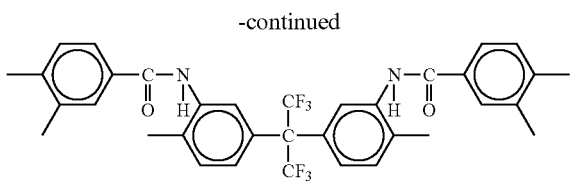

wherein, $R_{15}$ is a member selected from the group consisting of alkyl, halogen and mixtures thereof, and r is an integer of 0 to 2.

19. The polyamide resin according to claim 1, wherein a terminal end of the polyamide resin is capped with an acid anhydride or an acid derivative containing an aliphatic group so as to form an amide.

20. The polyamide resin according to claim 18, wherein the terminal end is capped by one or more of the following:

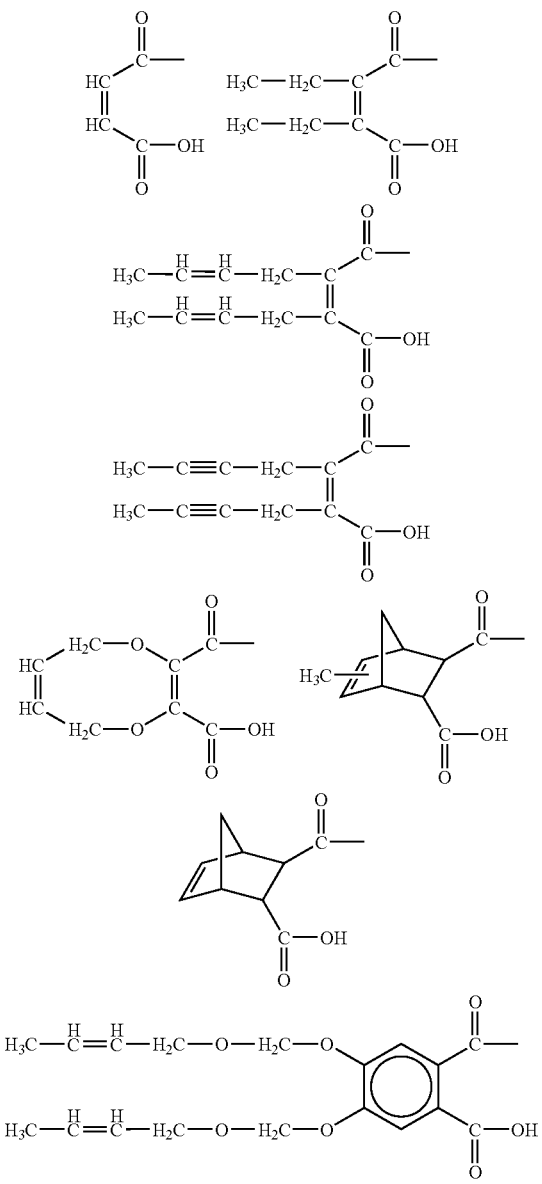

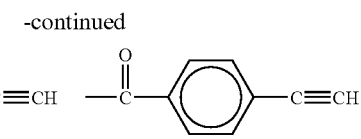

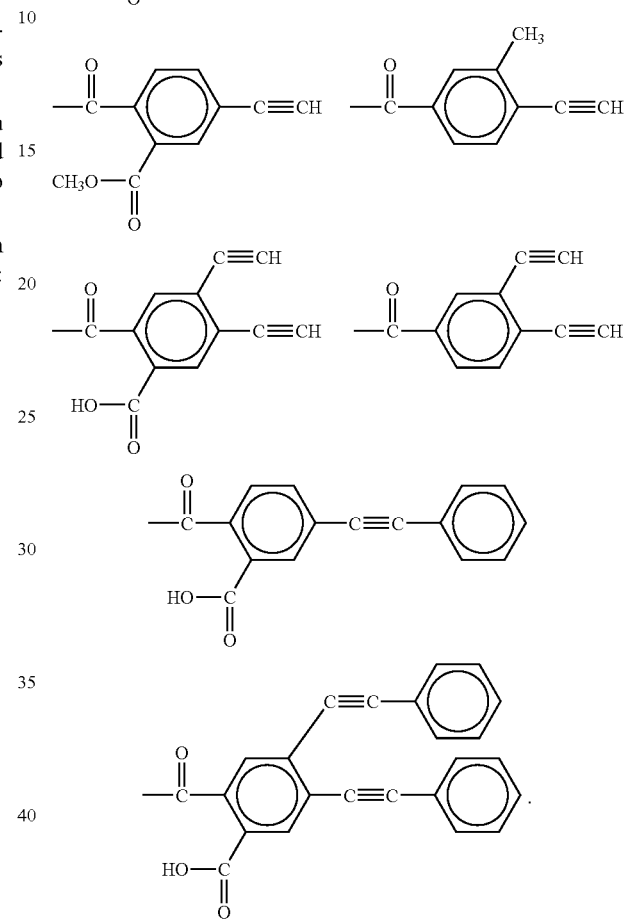

21. The positive-working photosensitive resin composition according to claim 3, wherein the compound B is an ester of phenol compound and 1,2-naphtho-quinone-2-diazide-5-sulfonic acid or 1,2-naphtho-quinone-2-diazide-4-sulfonic acid.

22. A varnish composition comprising the polyamide resin of claim 1 and a solvent therefore.

23. A polyamide resin according to claim 1, wherein the structure represented by the formula (2) is a member selected from the group consisting of:

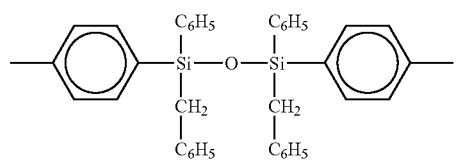

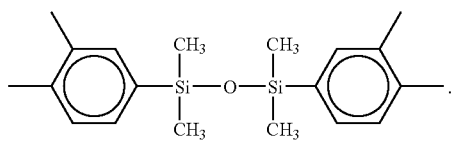

24. A positive working photosensitive resin composition according to claim 3, wherein $R_4$ and $R_5$ can be the same or different and is a member selected from the group consisting of alkylene, arylene with an alkyl substituent, combination of alkylene and unsubstituted arylene, and combination of alkylene and arylene with an alkyl substituent.

25. A positive working photosensitive resin composition according to claim 3, wherein the structure represented by the formula (2) is a member selected from the group consisting of:

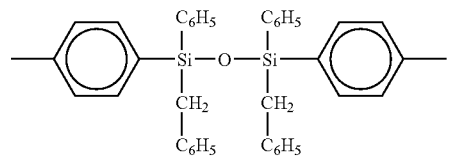

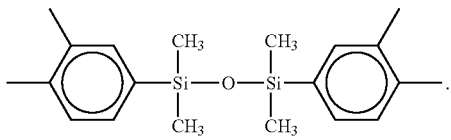

* * * * *